(12) United States Patent
Shim et al.

(10) Patent No.: US 10,451,905 B2
(45) Date of Patent: Oct. 22, 2019

(54) OPTICAL TRANSMISSION MODULE, OPTICAL TRANSCEIVER, AND OPTICAL COMMUNICATION SYSTEM INCLUDING SAME

(71) Applicant: Industry-University Cooperation Foundation Hanyang University Erica Campus, Ansan-si (KR)

(72) Inventors: Jong In Shim, Seoul (KR); Dong Soo Shin, Ansan-si (KR); Won Jin Choi, Seongnam-si (KR)

(73) Assignee: Industry-University Cooperation Foundation Hanyang University Erica Campus, Ansan-si (KR)

( * ) Notice: Subject to any disclaimer, the term of this patent is extended or adjusted under 35 U.S.C. 154(b) by 0 days.

(21) Appl. No.: 15/743,284

(22) PCT Filed: Jul. 8, 2016

(86) PCT No.: PCT/KR2016/007413
§ 371 (c)(1),
(2) Date: Jan. 10, 2018

(87) PCT Pub. No.: WO2017/010743
PCT Pub. Date: Jan. 19, 2017

(65) Prior Publication Data
US 2019/0033627 A1 Jan. 31, 2019

(30) Foreign Application Priority Data

Jul. 10, 2015 (KR) .................. 10-2015-0098561
Jul. 10, 2015 (KR) .................. 10-2015-0098562
(Continued)

(51) Int. Cl.
*H04B 10/116* (2013.01)
*H01L 33/06* (2010.01)
(Continued)

(52) U.S. Cl.
CPC .............. *G02F 1/017* (2013.01); *G02B 6/42* (2013.01); *G02B 6/4206* (2013.01);
(Continued)

(58) Field of Classification Search
CPC combination set(s) only.
See application file for complete search history.

(56) References Cited

U.S. PATENT DOCUMENTS

2002/0167710 A1 11/2002 Chan et al.
2004/0062282 A1* 4/2004 Matsuoka .............. B82Y 20/00
372/26
(Continued)

FOREIGN PATENT DOCUMENTS

JP 10-213784 8/1998
JP 2012-137541 7/2012
(Continued)

OTHER PUBLICATIONS

Grounds of Reasons for Rejection dated Apr. 12, 2018 From the Korean Intellectual Property Office Re. Application No. 10-2016-0082986. (4 pages).
(Continued)

*Primary Examiner* — Omar S Ismail

(57) ABSTRACT

An embodiment includes an optical transmission module, an optical transceiver, and an optical communication system including the same, the optical transmission module comprising: a light emitting diode; and an optical modulator for modulating first light emitted from the light emitting diode, wherein the light emitting diode and the optical modulator include GaN, and the optical modulator transmits the first light therethrough when a voltage is applied.

18 Claims, 21 Drawing Sheets

(30) Foreign Application Priority Data

Jun. 30, 2016 (KR) ........................ 10-2016-0082986
Jun. 30, 2016 (KR) ........................ 10-2016-0082991
Jun. 30, 2016 (KR) ........................ 10-2016-0082995

(51) Int. Cl.
```
G02F 1/017      (2006.01)
G02B 6/42       (2006.01)
H04B 10/40      (2013.01)
H04B 10/50      (2013.01)
H01L 33/32      (2010.01)
H04B 10/54      (2013.01)
G02F 1/015      (2006.01)
```

(52) U.S. Cl.
CPC ......... *G02B 6/4246* (2013.01); *G02B 6/4298* (2013.01); *H01L 33/06* (2013.01); *H01L 33/32* (2013.01); *H04B 10/116* (2013.01); *H04B 10/40* (2013.01); *H04B 10/502* (2013.01); *H04B 10/505* (2013.01); *H04B 10/541* (2013.01); *G02B 6/4207* (2013.01); *G02B 6/4212* (2013.01); *G02F 2001/0157* (2013.01); *G02F 2202/108* (2013.01)

(56) References Cited

U.S. PATENT DOCUMENTS

| | | | | |
|---|---|---|---|---|
| 2004/0135136 | A1* | 7/2004 | Takahashi | B82Y 20/00 257/14 |
| 2008/0210957 | A1 | 9/2008 | Watanabe et al. | |
| 2008/0219315 | A1* | 9/2008 | Makino | B82Y 20/00 372/50.1 |
| 2008/0247765 | A1* | 10/2008 | Mahgerefteh | G02B 5/281 398/187 |
| 2011/0026108 | A1* | 2/2011 | Takahashi | B82Y 20/00 359/344 |
| 2013/0248819 | A1* | 9/2013 | Aihara | H01L 33/06 257/13 |
| 2013/0270418 | A1* | 10/2013 | Cho | G02F 1/015 250/206.1 |
| 2015/0008463 | A1* | 1/2015 | Yoshida | C09K 11/675 257/98 |

FOREIGN PATENT DOCUMENTS

| | | |
|---|---|---|
| KR | 10-2001-0027717 | 4/2001 |
| KR | 10-2010-0066842 | 6/2010 |
| WO | WO 2017/010743 | 1/2017 |

OTHER PUBLICATIONS

Supplementary European Search Report and the European Search Opinion dated Mar. 4, 2019 From the European Patent Office Re. Application No. 16824660.1 (10 pages).

Sekiya et al. "GaN Freestanding Waveguides on Si Substrate for Si/GaN Hybrid Photonic Integration", 2015 Transducers—2015 18th International Conference on Solid-State Sensors, Actuators and Microsystems (Transducers). IEEE, XP033189700, 2057-2060, Jun. 21, 2015.

* cited by examiner

FIG. 13
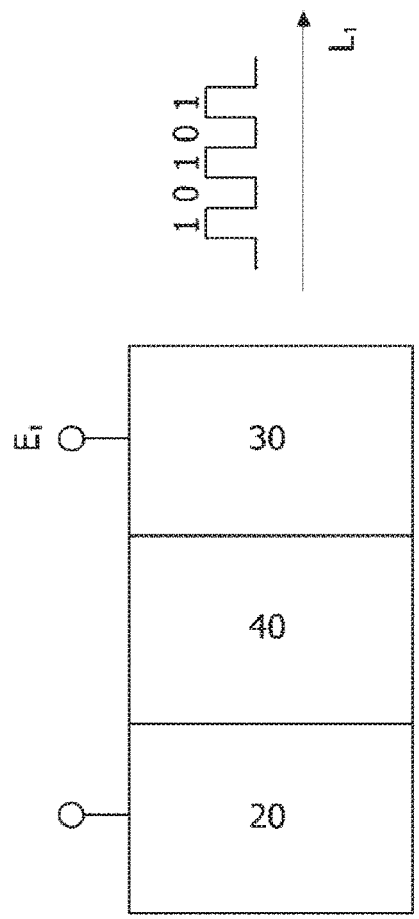
[FIG. 14]
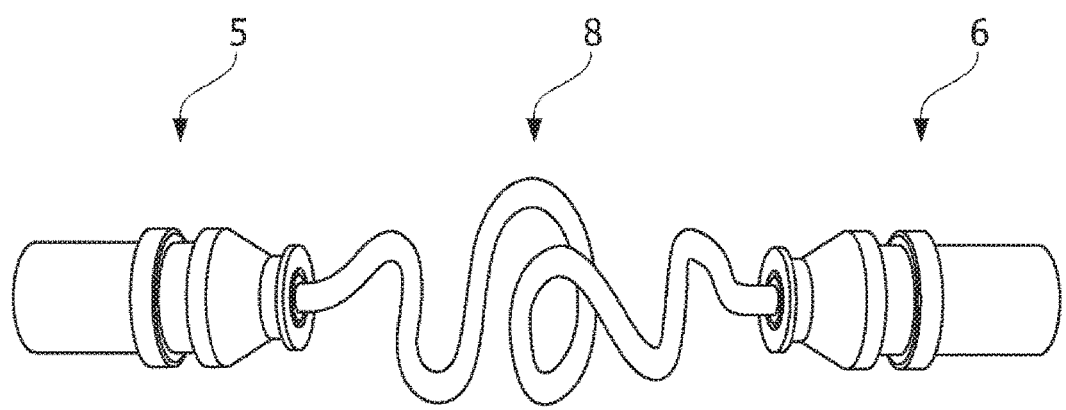

OPTICAL TRANSMISSION MODULE, OPTICAL TRANSCEIVER, AND OPTICAL COMMUNICATION SYSTEM INCLUDING SAME

RELATED APPLICATIONS

This application is a National Phase of PCT Patent Application No. PCT/KR2016/007413 having International filing date of Jul. 8, 2016, which claims the benefit of priority of Korean Patent Applications Nos. 10-2015-0098561 and 10-2015-0098562, both filed on Jul. 10, 2015, and 10-2016-0082986, 10-2016-0082991 and 10-2016-0082995, all filed on Jun. 30, 2016. The contents of the above applications are all incorporated by reference as if fully set forth herein in their entirety.

FIELD AND BACKGROUND OF THE INVENTION

Exemplary embodiments relate to an optical module, an optical transceiver, and an optical communication system including the same.

Digital transmission systems using optical fibers are currently most widely used in wired communication fields. When a wired communication network or a wired/wireless integrated subscriber communication network is operated, wired communication network performance may be determined by an optical transceiving module (or an optical transceiver) and other optical components.

An optical transceiver of a typical wired optical communication network may include an optical transmission module and an optical receiving module, and the optical transmission module may include a light-emitting device and an optical modulator.

Generally, an infrared (IR) laser diode (LD) having an oscillation wavelength region of about 1 μm is used as a light-emitting device for an optical communication network using a silica optical fiber as a transmission line. The light-emitting device and an optical modulator may be connected via a free space by using a lens, may be connected by using a waveguide formed of a material, such as a polymer, or may be connected by forming a waveguide on a wafer during a process of integrally forming the light-emitting device and the optical modulator.

Since the LD may output high-output high-quality light (e.g., light having a small spectrum half width), the LD is advantageous as a light source for transmitting a long-distance high-capacity light signal. However, since operating characteristics of the LD are sensitive to ambient temperature, a temperature compensation device (e.g., a thermoelectric cooler (TEC)) is required to obtain stable operation.

Furthermore, when emitted light is reflected by the surroundings and incident on the LD, the operating characteristics of the LD become very unstable. Thus, the use of an optical isolator is inevitable, and manufacturing costs of the LD itself are high.

Recently, the Internet of Things (IoT) era is coming with the development of network technology, sensor technology, radio-frequency identification (RFID) technology, and software technology. Optical communication networks including optical transceiving modules are necessarily required to connect a large number of devices. Accordingly, the development of optical transceiving modules capable of operating without a temperature compensation device and an optical isolator in an extreme environment of about −50° C. to about 150° C. is required. Here, a temperature range from about −50° C. to about 150° C. is an allowable temperature range for normal operations of a silicon (Si) integrated circuit (IC) that is used for various electronic circuits.

However, the LD is problematic in that reliability cannot be guaranteed in various temperature environments without a temperature compensation device and an optical isolator, and the LD is high-priced.

SUMMARY OF THE INVENTION

Exemplary embodiments provide an optical transmission module using a light-emitting diode (LED) as a light source.

Exemplary embodiments provide a horizontal optical transmission module.

Exemplary embodiments provide an optical module capable of transmitting a high-speed light signal over a short distance of several tens of meters (m) to several hundred m by adjusting a half width of a light spectrum.

Exemplary embodiments provide an optical module capable of operating at a low temperature of about −50° C. or lower or a high temperature of about 150° C. or higher.

Technical Solution

One aspect of the present invention provides an optical transmission module including a light-emitting diode (LED) and an optical modulator configured to modulate first light emitted by the LED. The LED and the optical modulator include GaN. The optical modulator transmits the first light when a voltage is applied thereto.

The optical modulator may transmit the first light when a reverse bias voltage is applied thereto.

The first light may be light of a visible wavelength band.

The LED and the optical modulator may include a nitride semiconductor layer.

The LED may include a first lower semiconductor layer, an active layer disposed on the first lower semiconductor layer, and a first upper semiconductor layer disposed on the active layer.

The optical modulator may include a second lower semiconductor layer, a light absorption layer disposed on the second lower semiconductor layer and configured to absorb the light output by the LED, and a second upper semiconductor layer disposed on the light absorption layer.

The active layer and the light absorption layer may include GaN.

An energy bandgap of the light absorption layer may increase when a reverse bias voltage is applied.

An absorption wavelength band of the light absorption layer may be shorter than a wavelength band of the first light when a reverse bias voltage is applied.

The optical transmission module may further include a filter configured to adjust a wavelength width of the first light. The optical modulator may modulate second light passing through the filter. A half width of the second light may be smaller than a half width of the first light.

A half width of the first light may range from about 10 nm to about 35 nm.

A half width of the second light may range from about 2 nm to about 10 nm.

The filter may include a first reflection unit, a cavity, and a second reflection unit, which are stacked sequentially. Each of the first reflection unit and the second reflection unit may include a first optical layer and a second optical layer, which are alternately stacked. The first optical layer and the second optical layer may include different oxides. The cavity may include a plurality of stacked second optical layers. The cavity may be thicker than the first optical layer or the second optical layer.

The second optical layer may have a higher refractive index than the first optical layer.

The first optical layer may have a refractive index of about 1.4 to about 1.5, and the second optical layer may have a refractive index of about 2.0 to about 3.0.

The first optical layer may include any one of $SiO_X$ ($1 \leq X \leq 3$) or $MgF_2$, and the second optical layer may include any one of $TiO_X$ ($1 \leq X \leq 3$), $TaO_X$ ($1 \leq X \leq 3$), or $ZrO_2$.

An active layer of the LED may have the same composition as a light absorption layer of the optical modulator.

The optical transmission module may further include a first lens disposed between the LED and the optical modulator.

According to exemplary embodiments, an optical module can be manufactured by using a light-emitting diode (LED) and an optical modulator. Accordingly, since an additional isolator and a temperature adjusting device (e.g., a thermoelectric cooler (TEC)) may be omitted, manufacturing costs of the optical module can be reduced.

According to exemplary embodiments, a high-speed light signal can be transmitted over a short distance of several tens of meters (m) to several hundred m by adjusting a half width of a light spectrum.

According to exemplary embodiments, each of an LED and an optical modulator can be formed of a gallium nitride (GaN)-based material to provide an optical module capable of operating even at a high driving temperature.

Various advantages and effects of the present invention are not limited to the above description and can be more easily understood during the description of specific exemplary embodiments of the present invention.

BRIEF DESCRIPTION OF THE SEVERAL VIEWS OF THE DRAWINGS

FIG. 13 is a conceptual diagram of a process of modulating a light signal due to an optical module.

FIG. 14 is a conceptual diagram of an optical transceiving module according to an exemplary embodiment of the present invention.

DESCRIPTION OF SPECIFIC EMBODIMENTS OF THE INVENTION

Figure 1:
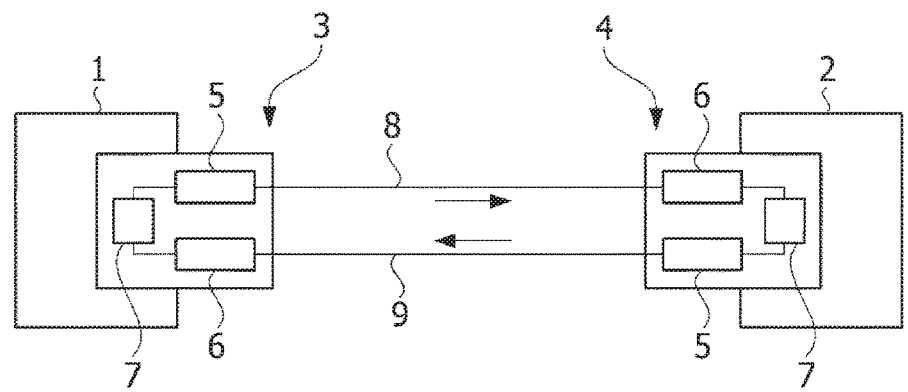
FIG. 1 is a conceptual diagram of an optical communication system according to an exemplary embodiment of the present invention.

Advantages and features of the present invention and methods of achieving the same will be clearly understood with reference to the following detailed embodiments. The embodiments are provided in order to fully explain the present invention and fully explain the scope of the present invention to those skilled in the art. The scope of the present invention is not defined by the appended claims. Like numbers refer to like elements throughout the specification The embodiments may be modified in other forms, or several embodiments may be combined with one another. The scope of the present invention is not limited to each of the embodiments described below.

Even when content described in a specific embodiment is not described in other embodiments, the content may be understood as being related to other embodiments unless described otherwise or the content contradicts specific embodiment in the other embodiments.

For example, when features of a component A are described in a specific embodiment and features of a component B are described in another embodiment, it should be understood that embodiments in which the component A is combined with the component B fall within the scope and spirit of the present invention even when they are not explicitly described.

Furthermore, embodiments of the present invention are described herein with reference to cross-section and/or plan illustrations that are schematic illustrations of idealized embodiments of the present invention. In the drawings, thicknesses of layers and regions are exaggerated to effectively explain technical content of the embodiments. Accordingly, for example, shapes of illustrated components may be modified as a result of manufacturing techniques and/or tolerances. Thus, embodiments of the present invention are not to be construed as limited to the particular shapes of regions illustrated herein, but are to be understood as including deviations in shapes that result from manufacturing. For example, an etched region illustrated as a rectangle will typically have rounded or curved features. Thus, the regions illustrated in the figures are schematic in nature and their shapes are not intended to illustrate the precise shape of a region of a device and are not intended to limit the scope of the present invention.

FIG. 1 is a conceptual diagram of an optical communication system according to an exemplary embodiment of the present invention.

Referring to FIG. 1, the optical communication module according to the exemplary embodiment may include a first optical transceiver 3 configured to communicate with a first host 1, a second optical transceiver 4 configured to communicate with a second host 2, and a channel connected between the first optical transceiver 3 and the second optical transceiver 4.

The first host 1 and the second host 2 are not specifically limited as long as the first host 1 and the second host 2 are various electronic devices capable of communication. For example, the first host 1 may be an engine control unit (ECU) of a vehicle, and the second host 2 may be one of various sensors (e.g., a camera module, a light sensor, etc.) disposed in the vehicle.

Although each of the first optical transceiver 3 and the second optical transceiver 4 is a bidirectional communication module including a transmission module 5 and a receiving module 6, exemplary embodiments of the present invention are not necessarily limited thereto. As an example, the first optical transceiver 3 may be an optical transmission module, and the second optical transceiver 4 may be an optical receiving module. Hereinafter, a bidirectional communication method will be described.

The transmission module 5 of the first optical transceiver 3 may be connected to the receiving module 6 of the second optical transceiver 4 by a first optical fiber 8. The transmission module 5 may convert an electric signal of a host into a light signal. A control unit 7 may modulate a light signal based on the electric signal of the host. As an example, the control unit 7 may include a driver integrated circuit (IC).

The receiving module 6 of the first optical transceiver 3 may be connected to the transmission module 5 of the second optical transceiver 4 by a second optical fiber 9. The receiving module 6 may convert a light signal into an electric signal. The control unit 7 may amplify the converted electric signal by using a transimpedance amplifier (TIA), or may extract packet information from the electric signal and transmit the packet information to the host.

Although FIG. 1 illustrates an example in which channels of a transmission signal and a receiving signal are differently configured by using the first optical fiber 8 and the second optical fiber 9, the present invention is not necessarily limited thereto. That is, bidirectional communication may be enabled by using a single optical fiber. Further, a plurality of first light modules may bidirectionally communicate with a plurality of second light modules by using a multiplexer. In addition, the optical communication system of FIG. 1 may also be applied to wireless communication which does not use wired channels.

Figure 2:
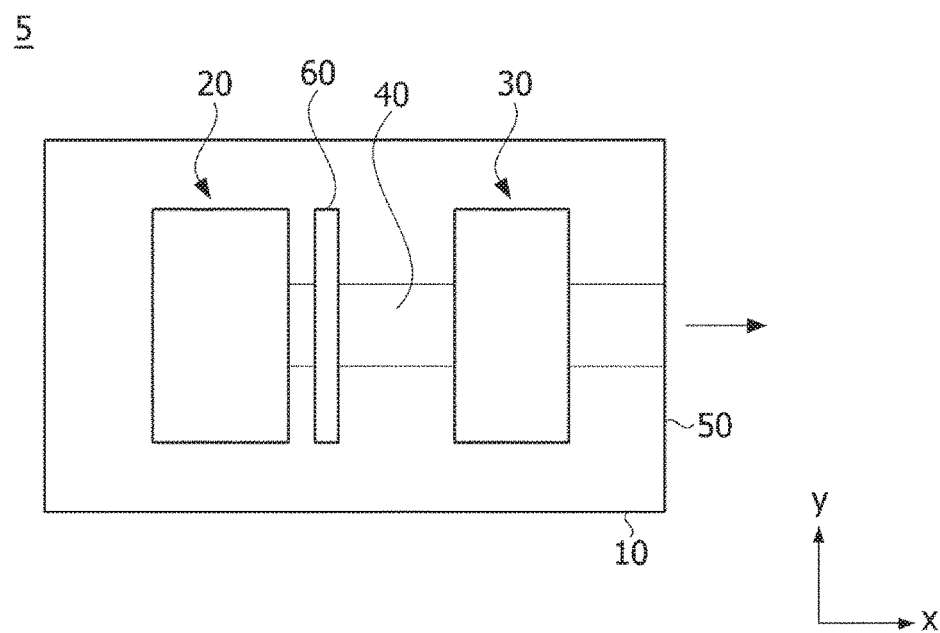
FIG. 2 is a conceptual diagram of an optical transmission module according to an exemplary embodiment of the present invention.

FIG. 2 is a perspective view of an optical transmission module according to an exemplary embodiment of the present invention.

Referring to FIG. 2, an optical transmission module 5 may include a light-emitting diode (LED) 20, a filter 60, an optical channel 40, an optical modulator 30, and an optical interface 50. The LED 20, the filter 60, and the optical modulator 30 may be disposed on a carrier substrate 10. However, the present invention is not necessarily limited thereto, and the LED 20, the filter 60, and the optical modulator 30 may be sequentially disposed in a direction in which light is emitted.

The LED 20 is insensitive to a variation in operating temperature because of its large energy bandgap. Accordingly, a temperature compensation device may be omitted. When the LED 20 includes a nitride semiconductor, a bandgap of an active layer may be about 2.0 eV to about 3.0 eV.

Furthermore, less noise is generated by re-incident light in the LED 20 than in a laser diode (LD). Thus, an optical isolator may be omitted. In addition, the LED 20 is lower in price than the LD. Accordingly, when the LED 20 is used, manufacturing costs of the optical transmission module 5 may be reduced.

In contrast, since operating characteristics of the LD are sensitive to a variation in an ambient temperature, a temperature compensation device is needed to obtain stable operation. When emitted light is reflected by the surroundings and incident on the LD again, the operating characteristics of the LD become very unstable. Thus, the use of an optical isolator is inevitable, and manufacturing costs of the LD itself are high.

The filter 60 may control a wavelength width (emission linewidth) of light emitted by an LED. Since a wavelength width of a nitride-based LED is generally as wide as about 20 nm, there is a problem in that an operating voltage of the optical modulator 30 becomes high to obtain a sufficient extinction ratio.

When a wavelength width of light is controlled by using the filter 60, a high-speed light signal may be transmitted over a short distance of several tens of meters (m) to several hundred m while a sufficient extinction ratio is achieved.

The optical channel 40 may optically connect the LED 20 with the optical modulator 30. Accordingly, light output by the LED 20 may be provided to the optical modulator 30 through the optical channel 40. Although the optical channel 40 may be an optical waveguide, the optical channel 40 is not necessarily limited thereto. For example, the optical channel 40 may be an empty passage through which light may pass or a plurality of optical components (e.g., lenses) disposed on a light path.

The optical modulator 30 may modulate light incident thereon. Hereinafter, an example in which the optical modulator 30 is an electro-absorption optical modulator (EAM) will be described, but a configuration of the optical modulator 30 is not necessarily limited thereto.

The EAM may be driven at a low voltage and enable downscaling of devices. The optical modulator 30 may change a degree of light absorption according to an applied voltage.

The optical modulator 30 may modulate a light signal by emitting (in an on-state) or not emitting (in an off-state) incident light to the outside according to a variation in applied voltage.

The optical interface 50 may include a connector connected to an external optical fiber. A light signal modulated by the optical modulator 30 may be transmitted to the outside through the optical interface 50.

Figure 3:
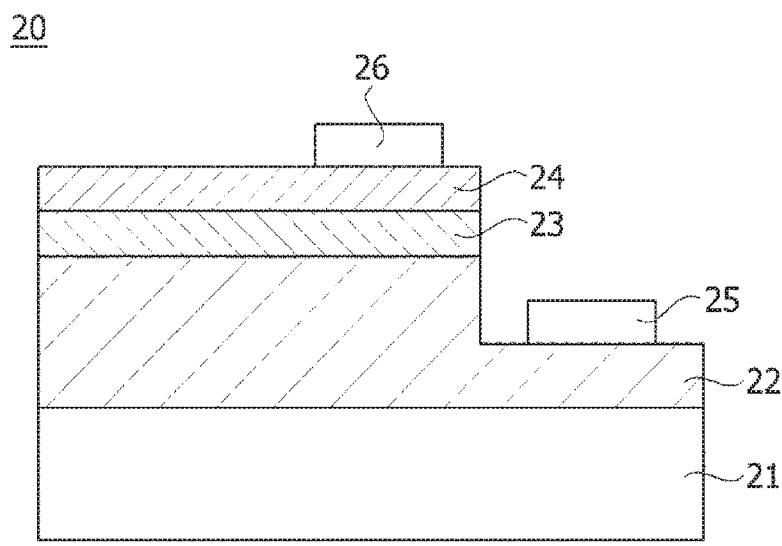
FIG. 3 is a cross-sectional view of a light-emitting diode (LED) of FIG. 2.

FIG. 3 is a cross-sectional view of the LED 20 of FIG. 2.

Referring to FIG. 3, the LED 20 may include a first substrate 21, a first lower semiconductor layer 22, a first active layer 23, and a first upper semiconductor layer 24.

The first lower semiconductor layer 22, the first active layer 23, and the first upper semiconductor layer 24 may be sequentially stacked on the first substrate 21. The first substrate 21 may include, for example, one of a sapphire substrate, a silicon substrate, a silicon carbide substrate, a plastic substrate, or a glass substrate. The first substrate 21 may be removed as needed.

A buffer layer (not shown) may be disposed between the first lower semiconductor layer 22 and the first substrate 21. The buffer layer may mitigate a lattice mismatch between an emission structure and the first substrate 21.

The buffer layer may include a combination of a Group III element and a Group V element or any one selected from the group consisting of GaN, InN, AN, InGaN, AlGaN, InAlGaN, and AlInN. The buffer layer may be doped with a dopant, but is not limited thereto.

The buffer layer may be grown as a single crystal on the first substrate 21. The buffer layer being grown as a single crystal may improve crystallinity of the first lower semiconductor layer 22.

The first lower semiconductor layer 22 may be disposed on the first substrate 21. The first lower semiconductor layer 22 may be an n-type semiconductor layer including a gallium nitride (GaN)-based material.

For example, the first lower semiconductor layer 22 may include any one of gallium nitride (GaN), aluminum gallium nitride (AlGaN), indium gallium nitride (InGaN), or aluminum gallium indium nitride ($Al_xGa_yIn_zN$, wherein x+y+z=1, 0≤x≤1, 0≤y≤1, and 0≤z≤1).

The first lower semiconductor layer 22 may be formed of a nitride doped with an n-type dopant. The n-type dopant may include silicon (Si), germanium (Ge), or tin (Sn). The first lower semiconductor layer 22 may have a structure obtained by alternately stacking a first layer doped with the n-type dopant and a second layer that is not doped with the n-type dopant.

It may be possible to grow a single n-type nitride layer to form the first lower semiconductor layer 22. A first electrode 25 may be formed on an exposed top surface of the first lower semiconductor layer 22. The first electrode 25 may include a Cr/Au film, a Cr/Ni/Au film, a Ti/Al/Au film, or a Ti/Ni/pt/Au film.

The first active layer 23 may be disposed on the first lower semiconductor layer 22. The first active layer 23 may cover a part of an upper portion of the first lower semiconductor layer 22, and may be disposed apart from the first electrode 25.

The first active layer 23 may generate light due to an externally applied power. The generated light may proceed to the first lower semiconductor layer 22 and the first upper semiconductor layer 24. The first active layer 23 may have a multi-quantum well (MQW) structure including a plurality of quantum well (QW) structures.

The first active layer 23 may have a quantum barrier (QB) layer and a QW layer. The QB layer and the QW layer of the first active layer 23 having the MQW structure may include aluminum gallium indium nitride ($Al_xGa_yIn_zN$, wherein x+y+z=1, 0≤x≤1, 0≤y≤1, and 0≤z≤1) having different composition ratios of x, y, and z. In this case, a bandgap of the QW layer should be lower than bandgaps of the QB layer, the first lower semiconductor layer 22, and the first upper semiconductor layer 24.

The QW layer and the QB layer of the first active layer 23 may have a structure including at least one pair selected from the group consisting of AlGaN/AlGaN, InGaN/GaN, InGaN/InGaN, GaN/AlGaN, InAlGaN/GaN, GaAs(InGaAs)/AlGaAs, and GaP(InGaP)/AlGaP, but is not limited thereto. The QW layer of the first active layer 23 may be formed of a material having a bandgap lower than a bandgap of the QB layer.

The first upper semiconductor layer 24 may be disposed on the first active layer 23. The first upper semiconductor layer 24 may be a p-type semiconductor layer including a gallium nitride (GaN)-based material. For example, the first upper semiconductor layer 24 may be any one of p-type gallium nitride (GaN), p-type aluminum gallium nitride (AlGaN), or p-type aluminum gallium indium nitride (AlGaInN). Further, the first upper semiconductor layer 24 may have a structure obtained by alternately stacking at least two of p-type gallium nitride (GaN), p-type aluminum gallium nitride (AlGaN), or p-type aluminum gallium indium nitride (AlGaInN). A second electrode 26 may be disposed on the first upper semiconductor layer 24.

The second electrode 26 may include a transparent electrode layer, a Cr/Au film, a Ni/Au film, a Ni/Ti/Au film, or a Pt/Au film. The transparent electrode layer may include a transparent conductive oxide, and may be formed of any one of indium tin oxide (ITO), indium oxide (CIO), zinc oxide (ZnO), or nickel oxide (NiO).

An electron blocking layer (EBL) may be disposed between the first active layer 23 and the first upper semiconductor layer 24. The EBL may prevent the flow of electrons supplied from the first lower semiconductor layer 22 into the first upper semiconductor layer 24 and increase a probability of the electrons being recombined with holes in the first active layer 23. An energy bandgap of the EBL may be higher than an energy bandgap of the first active layer 23 and/or the first upper semiconductor layer 24.

The EBL may include one selected from semiconductor materials (e.g., AlGaN, InGaN, InAlGaN, and the like) having a composition formula of $In_{x1}Al_{y1}Ga_{1-x1-y1}N$ (0≤x1≤1, 0≤y1≤1, and 0≤x1+y1≤1), but is not limited thereto.

Although the LED has been described as being a horizontal LED, a structure of the LED according to an exemplary embodiment is not limited thereto. As an example, the LED may be a vertical LED in which a first electrode is disposed at a lower portion, and a second electrode is disposed at an upper portion.

Figure 4:
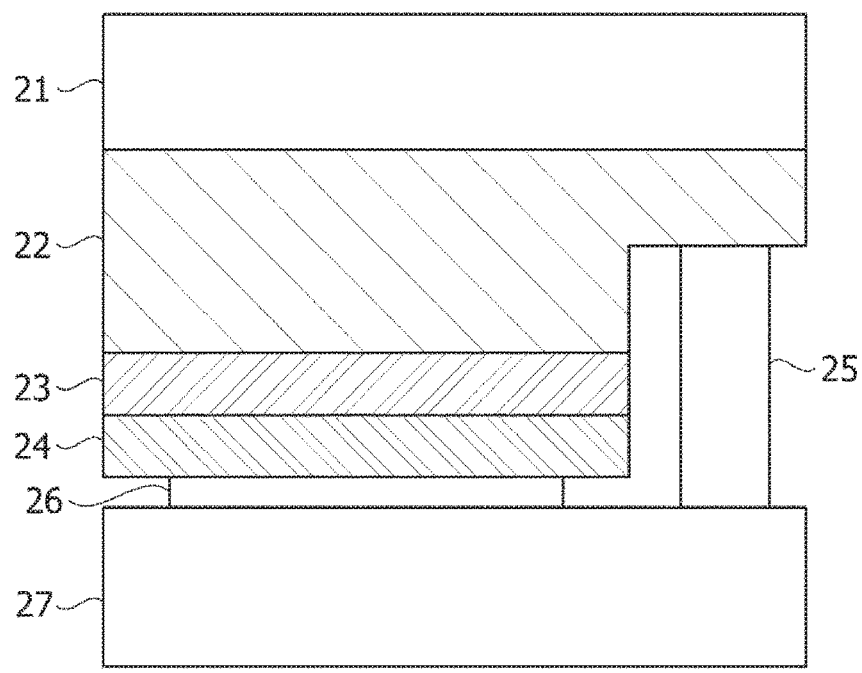
FIG. 4 illustrates a modified example of FIG. 3.

Referring to FIG. 4, the LED may be a flip-chip LED having one side on which the first electrode 25 and the second electrode 26 are disposed. The first electrode 25 and the second electrode 26 may be electrically connected to a sub mount 27.

Figure 5:
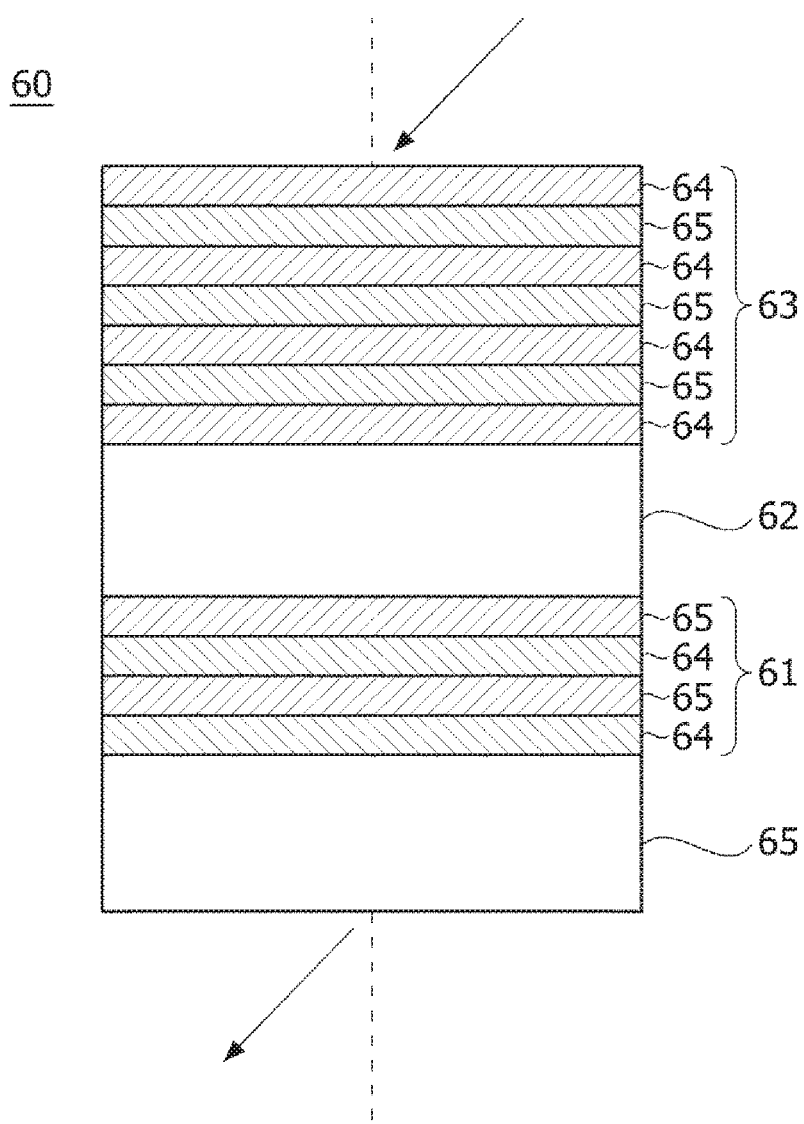
FIG. 5 is a cross-sectional view of a filter of FIG. 2.
Figure 6:
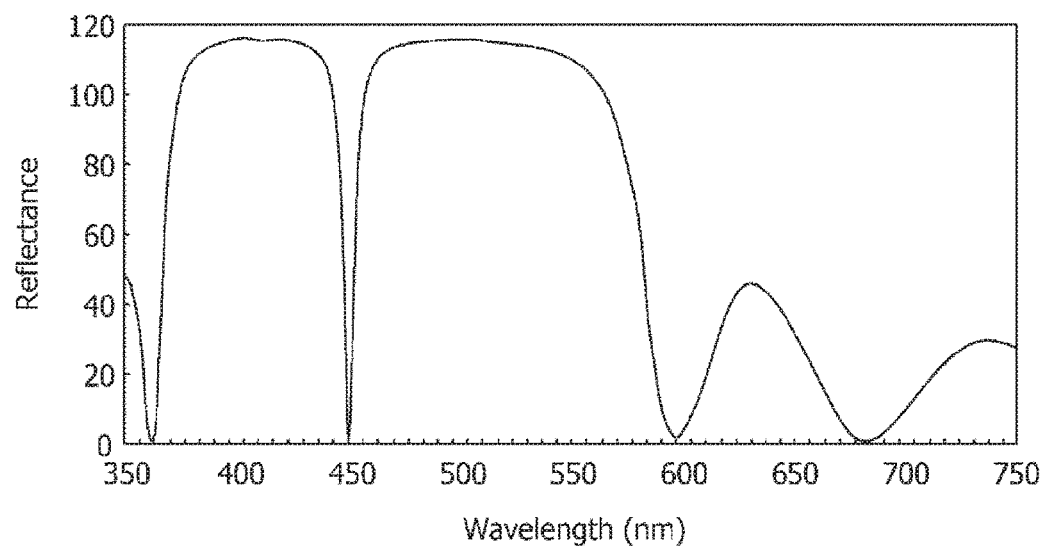
FIG. 6 is a graph showing reflectance relative to a wavelength band of a filter.
Figure 7:
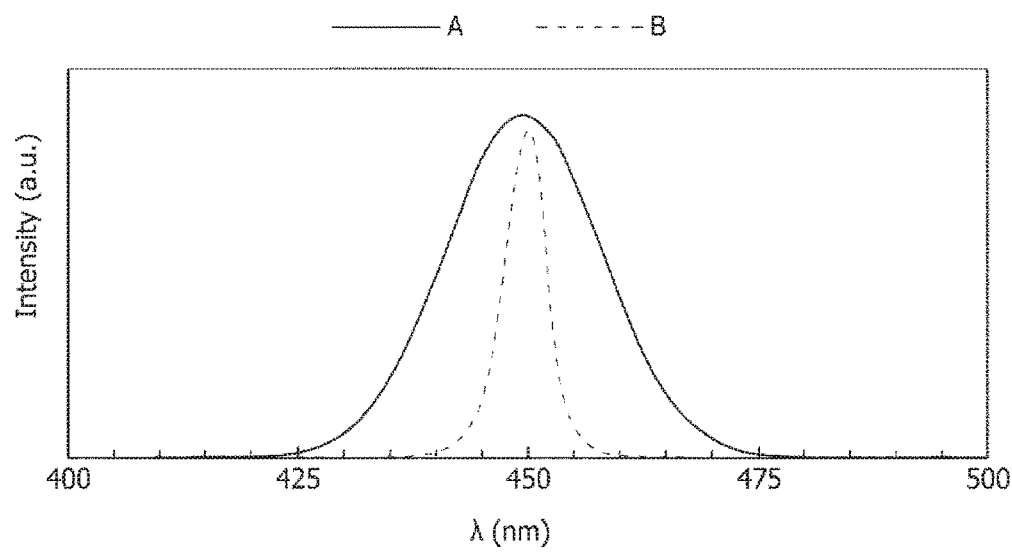
FIG. 7 is a graph showing a wavelength width of light emitted by an LED and a wavelength width of light passing through a filter.
Figure 8:
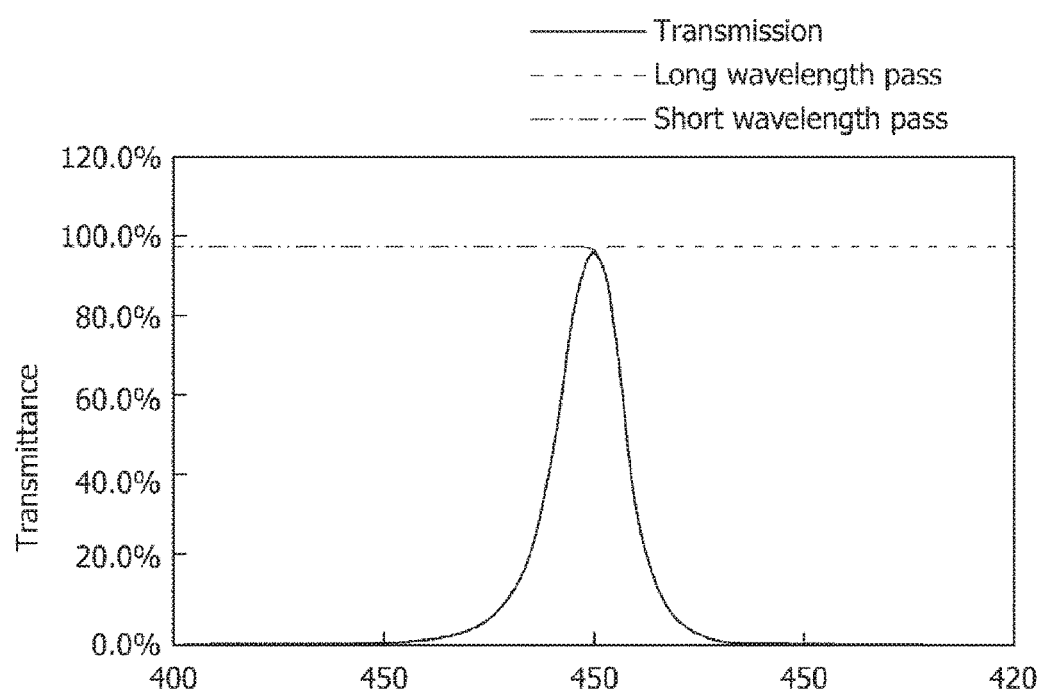
FIG. 8 is a graph showing a wavelength width of light passing through a band pass filter.

FIG. 5 is a cross-sectional view of the filter 60 of FIG. 2. FIG. 6 is a graph showing a reflectance relative to a wavelength band of the filter 60. FIG. 7 is a graph showing a wavelength width of light emitted by an LED and a wavelength width of light passing through the filter 60. FIG. 8 is a graph showing a wavelength width of light passing through a band pass filter.

Referring to FIG. 5, the filter 60 may control a wavelength width of light emitted by the LED. The filter 60 may have a structure obtained by alternately stacking a silicon dioxide optical layer and a titanium dioxide optical layer. Further, the filter 60 may have a structure obtained by alternately stacking a first optical layer 64, which includes any one of $SiO_X$ (1≤X≤3) or $MgF_2$, and a second optical layer 65, which includes any one of $TiO_X$ (1≤X≤3), $TaO_X$ (1≤X≤3), or $ZrO_2$.

The first optical layer 64 may have a refractive index of about 1.4 to about 1.5, and the second optical layer 65 may have a refractive index of about 2.0 to about 3.0.

The filter 60 may include a first reflection unit 61, a cavity 62, and a second reflection unit 63, which are sequentially stacked on a substrate.

Each of the first reflection unit 61 and the second reflection unit 63 may have a structure obtained by alternately stacking the first optical layer 64 and the second optical layer 65 including different oxides, and the cavity 62 may have a structure obtained by stacking a plurality of second optical layers 65. For example, the first optical layer 64 may be a silicon dioxide ($SiO_2$) optical layer, and the second optical layer 65 may be a titanium dioxide ($TiO_2$) optical layer.

The cavity 62 may have a greater thickness than the first optical layer 64 or the second optical layer 65. Each of the first and second optical layers 64 and 65 may have an optical thickness QWOT corresponding to ¼ of a wavelength of light. According to the exemplary embodiment of the present invention, the first reflection unit 61 may have a structure obtained by alternately stacking four silicon dioxide optical layers and three titanium dioxide optical layers.

The cavity 62 may have a structure including four titanium dioxide optical layers. The second reflection unit 63 may have a structure obtained by alternately stacking two silicon dioxide optical layers and two titanium dioxide optical layers. Since the cavity 62 includes only the titanium dioxide optical layers, the cavity 62 may serve to resonate and transmit light incident thereon to the filter 60. As the number of pairs of the silicon dioxide optical layers and the titanium dioxide optical layers that are alternately stacked increases, a spectrum half width of light transmitted through the filter 60 may be reduced. Due to the reduction in the spectrum half width of light, the filter 60 may selectively transmit light of a specific wavelength band.

Light emitted by the LED may be incident on the second reflection unit 63 and emitted to the substrate 65.

Referring to FIG. 6, it can be seen that a filter is designed to transmit light having only a wavelength band of about 450 nm from among a wavelength band of about 350 nm to about 500 nm and reflect all light having the remaining wavelength band.

Referring to FIG. 7, a spectrum half width of first light B transmitted through the filter may be less than a spectrum half width of second light A that is not transmitted through a distributed Bragg reflector (DBR) filter.

A half width of the first light B may range from about 10 nm to about 35 nm, and a half width of the second light A may range from about 2 nm to about 10 nm.

As an example, the spectrum half width of the first light A that is not transmitted through the filter may be about 18 nm, and the spectrum half width of the second light B transmitted through the DBR filter may be about 5 nm. In this case, light intensity may be about 5% to about 25% lower than light intensity before the light is filtered. However, since light intensity of a typical blue LED ranges from several tens of mW to several hundred mW, the light intensity may not affect transmission of a light signal.

The filter may control a spectrum half width of transmitted light. Accordingly, light having a wavelength of about 440 nm to about 460 nm and a half width of about 2 nm to about 10 nm may be provided due to the filter being used.

Referring to FIG. 8, the filter may be manufactured by combining a low-band pass filter with a high-band pass filter. That is, light having a wavelength of about 450 nm or less may be may be blocked by the high-band pass filter, and light exceeding the wavelength of about 450 nm may be blocked by the low-band pass filter, and thus the filter may transmit only light having the wavelength of about 450 nm. Accordingly, only light having the wavelength of about 450 nm may pass through the filter.

Figure 9:
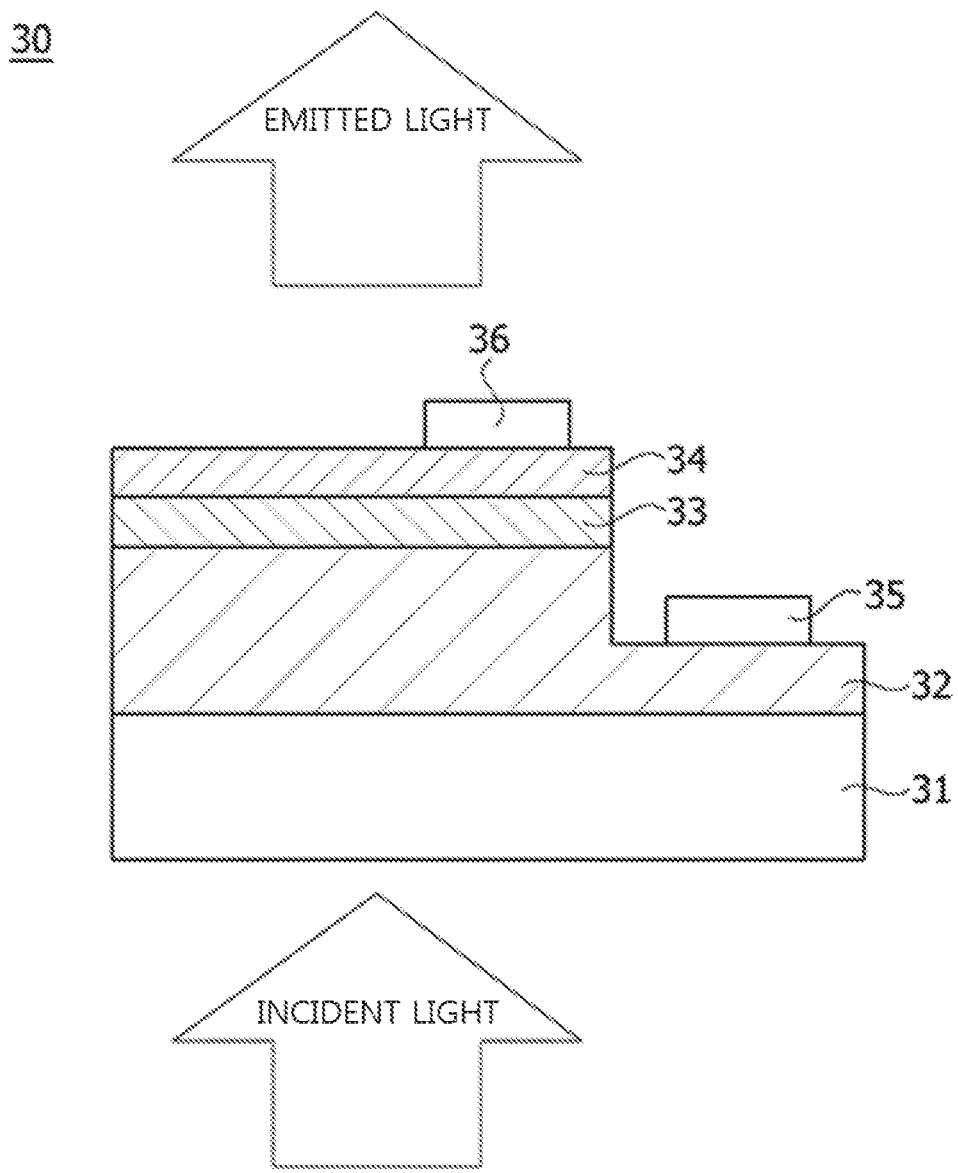
FIG. 9 is a conceptual diagram of an optical modulator.
Figure 10:
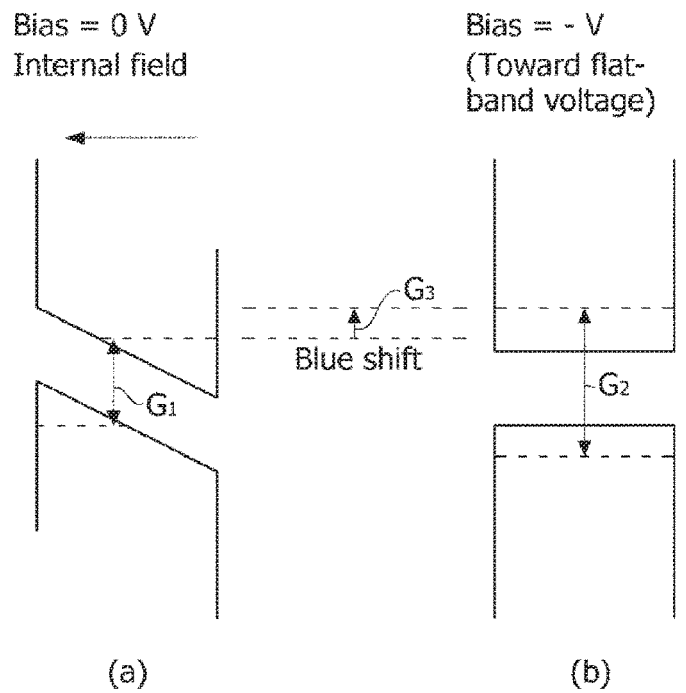
FIG. 10 is a diagram showing a state in which an energy bandgap is changed by the application of a reverse bias.
Figure 11:
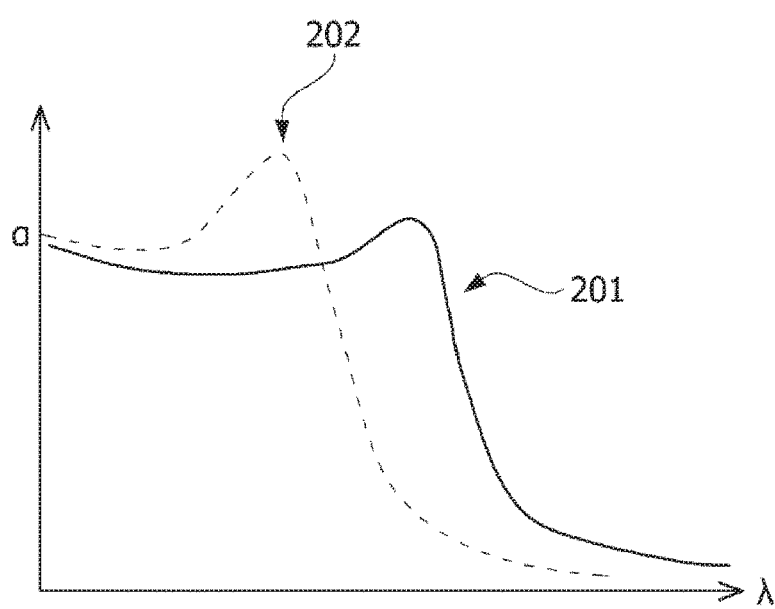
FIG. 11 is a diagram showing a state in which an absorption wavelength band of an optical modulator is changed by the application of a reverse bias.
Figure 12:
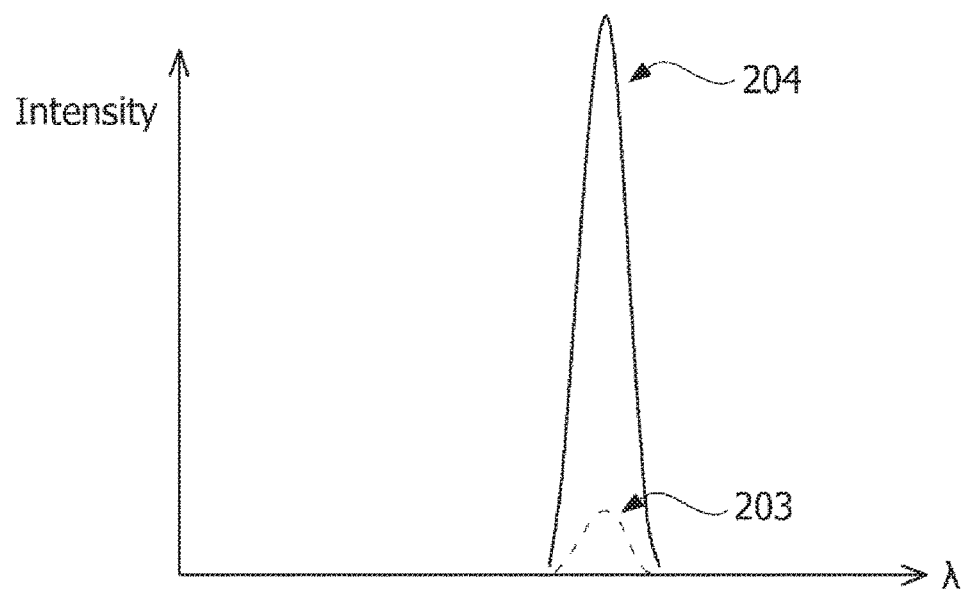
FIG. 12 is a graph showing a state in which the intensity of light emitted by a light-emitting device is changed by the application of a reverse bias.

FIG. 9 is a conceptual diagram of an optical modulator. FIG. 10 is a diagram showing a state in which an energy bandgap is changed by the application of a reverse bias. FIG. 11 is a diagram showing a state in which an absorption wavelength band of an optical modulator is changed by the application of a reverse bias. FIG. 12 is a graph showing a state in which the intensity of light emitted by a light-emitting device is changed by the application of a reverse bias. FIG. 13 is a conceptual diagram of a process of modulating a light signal due to an optical module.

Referring to FIG. 9, the optical modulator 30 may modulate light (incident light) output by the LED 20. A structure of the optical modulator 30 is not specifically limited. As an example, any one of a horizontal structure, a vertical structure, and a flip-chip structure may be applied to the optical modulator 30. Hereinafter, the horizontal structure will be described as an example.

The optical modulator 30 may include a second substrate 31, a second lower semiconductor layer 32, a light absorption layer 33, and a second upper semiconductor layer 34.

The second substrate 31 may be stacked on a carrier substrate. The second substrate 31 may include, for example, one of a sapphire substrate, a gallium nitride (GaN) substrate, a zinc oxide (ZnO) substrate, a gallium arsenide (GaAs) substrate, a gallium phosphide (GaP) substrate, a lithium aluminum oxide ($LiAl_2O_3$) substrate, a boron nitride (BN) substrate, an aluminum nitride (AlN) substrate, a plastic substrate, or a glass substrate.

The second lower semiconductor layer 32 may be disposed on the second substrate 31. The second lower semiconductor layer 32 may be an n-type semiconductor layer including a gallium nitride (GaN)-based material. For example, the second lower semiconductor layer 32 may include any one of gallium nitride (GaN), aluminum gallium nitride (AlGaN), indium gallium nitride (InGaN), or aluminum gallium indium nitride ($Al_xGa_yIn_zN$, wherein x+y+z=1, 0≤x≤1, 0≤y≤1, 0≤z≤1).

The second lower semiconductor layer 32 may be formed of a nitride doped with an n-type dopant. The n-type dopant may include silicon (Si), germanium (Ge), or tin (Sn). The second lower semiconductor layer 32 may have a structure obtained by alternately stacking a first layer doped with the n-type dopant and a second layer that is not doped with the n-type dopant.

It may be possible to grow a single n-type nitride layer to form the second lower semiconductor layer 32. A third electrode 35 may be formed on an exposed top surface of the second lower semiconductor layer 32. The third electrode 35 may include a Cr/Au film, a Cr/Ni/Au film, a Ti/Al/Au film, or a Ti/Ni/Pt/Au film.

The light absorption layer 33 may be directly connected to an optical channel and receive light generated by the LED 20. The light absorption layer 33 may have an energy bandgap that is nearly identical to that of an active layer of the LED 20 to absorb or transmit light output by the LED 20.

The light absorption layer 33 may cover a portion of the second lower semiconductor layer 32, and may be disposed apart from the third electrode 35. The light absorption layer 33 may modulate light by using an electric signal provided from the outside (e.g., a driver chip).

The light absorption layer 33 may have an MQW structure including a plurality of QW structures. The light absorption layer 33 may include a gallium nitride (GaN)-based material.

The light absorption layer 33 may have a QB layer and a QW layer. The QB layer and the QW layer of the light absorption layer 33 having the MQW structure may include aluminum gallium indium nitride ($Al_xGa_yIn_zN$, wherein x+y+z=1, 0≤x≤1, 0≤y≤1, and 0≤z≤1) having different composition ratios of x, y, and z. In this case, a bandgap of the QW layer may be lower than bandgaps of the QB layer, the second lower semiconductor layer 32, and the second upper semiconductor layer 34.

When the light absorption layer 33 has a structure including a Ga polar InGaN QW layer and a GaN QB layer, a bandgap of the light absorption layer 33 may be adjusted to be equal to a bandgap of the LED 20 at a zero bias. However, when a reverse bias is applied to the optical modulator 30, a bandgap of the optical modulator 30 may be higher than the bandgap of the LED 20.

A half width of a light spectrum is about 15 nm to about 40 nm in a section in which the bandgap of the LED is about 2.0 eV to about 3.0 eV. By applying an external bias to the optical modulator 30, the optical modulator 30 should cover a wavelength band which is about 0.5 times to about 3 times larger than a wavelength band of about 15 nm to about 40 nm. Accordingly, an energy bandgap of the light absorption layer 33 may be about 0.85 to 1.15 times an energy bandgap of the active layer. The energy bandgap of the light absorption layer 33, which may be adjusted by a reverse bias, may be about 50 meV to about 300 meV.

The second upper semiconductor layer 34 may be disposed on the light absorption layer 33. The second upper semiconductor layer 34 may be a p-type semiconductor layer including a gallium nitride (GaN)-based material. For example, the second upper semiconductor layer 34 may include any one of p-type gallium nitride (GaN), p-type aluminum gallium nitride (AlGaN), or p-type aluminum gallium indium nitride (AlGaInN). Further, the second upper semiconductor layer 34 may have a structure obtained by alternately stacking at least two of p-type gallium nitride (GaN), p-type aluminum gallium nitride (AlGaN), or p-type aluminum gallium indium nitride (AlGaInN).

Referring to (a) of FIG. 10, an energy bandgap G1 of a QW layer and a QB layer is asymmetrically formed in a GaN-based semiconductor device. This is due to the fact that there is a strong piezoelectric field inside a light absorption layer. The piezoelectric electric field may be generated due to various causes. As an example, the piezoelectric field may be generated due to a strain caused by a lattice mismatch.

However, when a reverse bias is applied to the light absorption layer, as shown in (b) of FIG. 10, an energy band G2 becomes relatively flat, and an energy bandgap G3 may become large.

A wavelength of light absorbed by the light absorption layer is determined by the energy bandgap. Referring to FIG. 11, a first absorption wavelength band 201 is obtained at a zero bias, and when a reverse bias voltage is applied thereto, an absorption wavelength band 202 may be sifted to be a short wavelength.

Referring to FIG. 12, before a reverse bias voltage is applied to a light-emitting device, intensity of light output thereby is hardly observed (203). That is, the light output by the light-emitting device is mostly absorbed by the light absorption layer.

However, it can be seen that, after the reverse bias voltage is applied to the light-emitting device, the intensity of the light increases (204). That is, it can be seen that an absorption wavelength band of the light absorption layer varies due to the reverse bias voltage and light output by the light-emitting device is not absorbed.

Referring to FIG. 13, the optical transmission module 5 may modulate a light signal L1 by using an electric signal E1. A state in which the electric signal E1 is provided may be referred to as a "state 1," while a state in which the electric signal E1 is not provided may be referred to as a "state 0." Here, the electric signal E1 may be a reverse bias voltage.

In the "state 1," the optical transmission module 5 may emit the light signal L1 (on-state). In the "state 0," the optical transmission module 5 may not emit the light signal L1 (off-state). Thus, the optical transmission module 5 may output a pulsed light signal that periodically emits (on-state) the light signal L1 or does not emit (off-state) the light signal L1.

The optical transmission module 5 according to exemplary embodiments may be used for short-distance communication.

For example, the optical transmission module 5 may be used for intelligent transport systems (ITSs), visual communication, wired short-distance optical fiber communication, intranets, home networking, and wired/wireless Internets of Things (IoT). The optical transmission module 5 according to the exemplary embodiment of the present invention may be used for data transmission networks having a transmission rate of several hundred Mbps to several tens of Gbps in the future.

Figure 15:
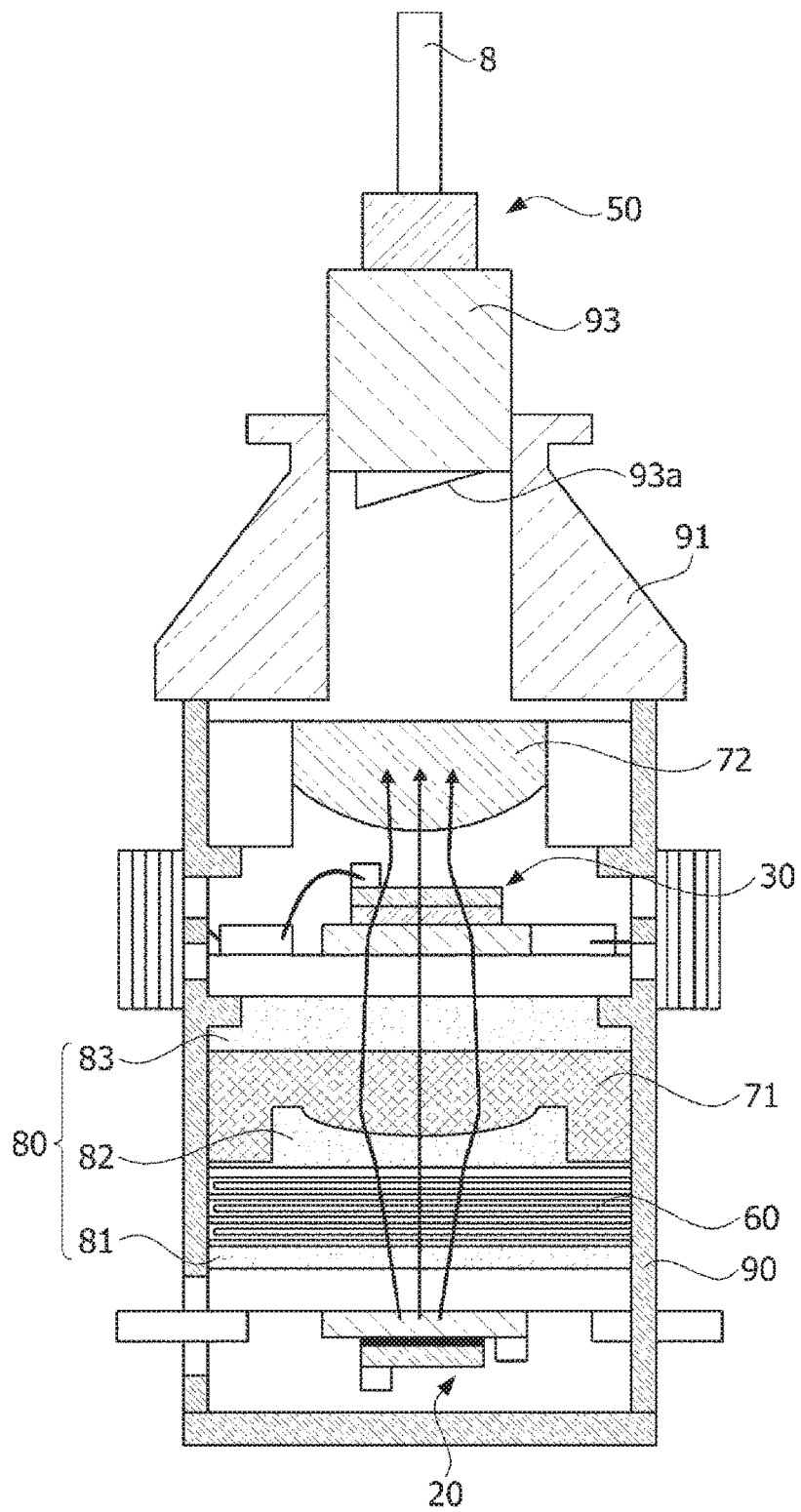
FIG. 15 is a conceptual diagram of an optical transmission module according to an exemplary embodiment of the present invention.
Figure 16:
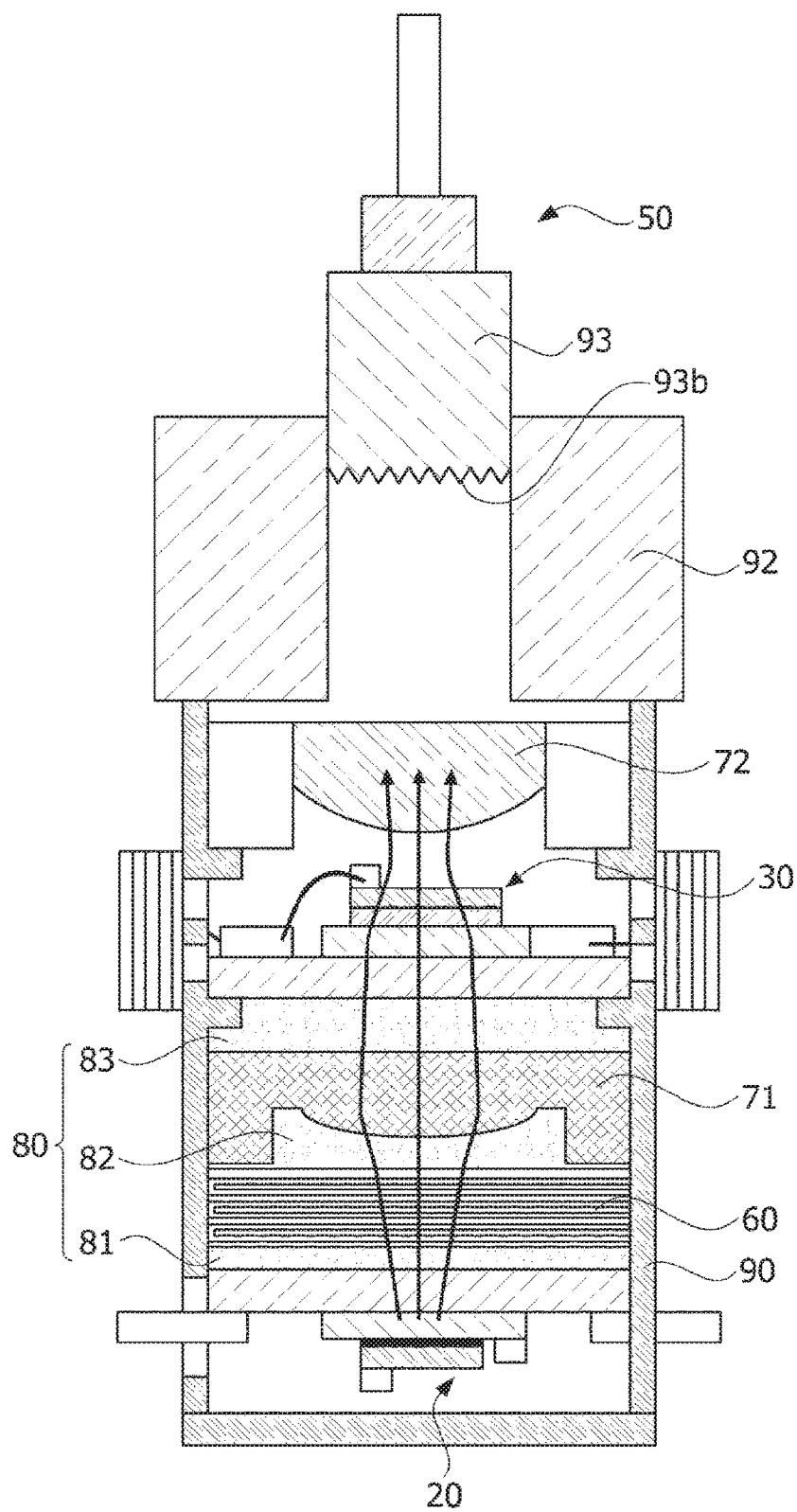
FIG. 16 illustrates a first modified example of FIG. 15.
Figure 17:
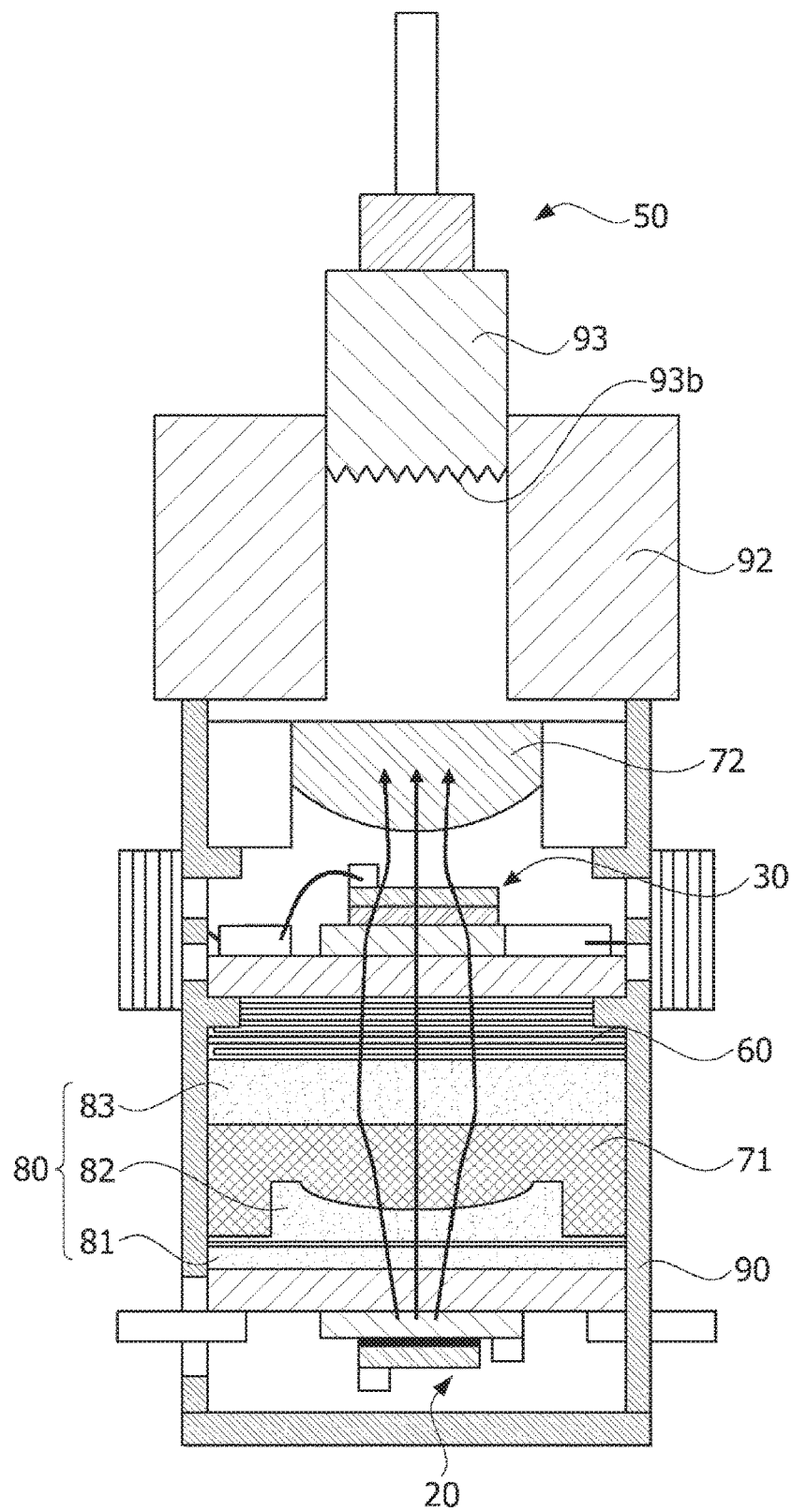
FIG. 17 illustrates a second modified example of FIG. 15.
Figure 18:
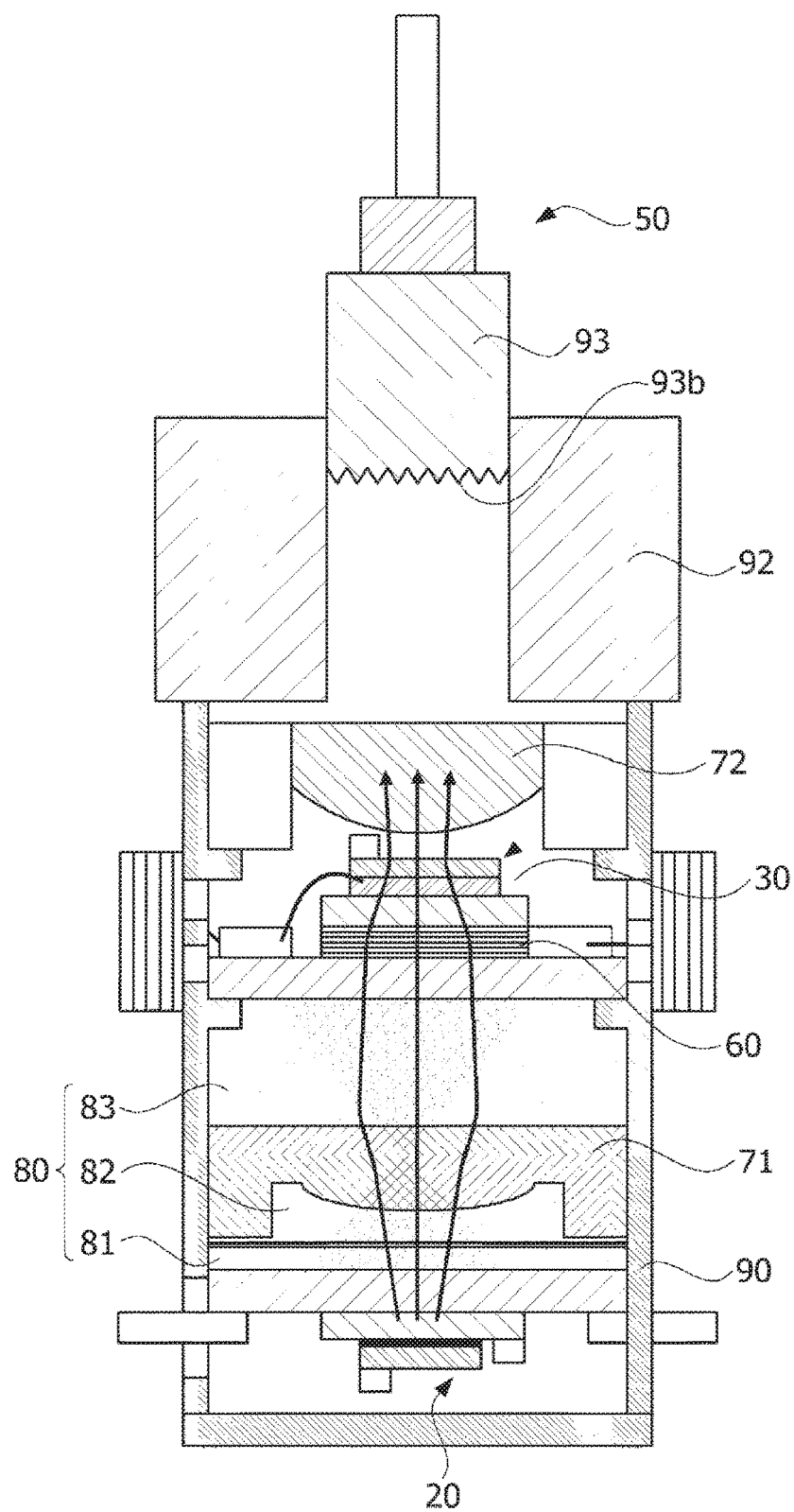
FIG. 18 illustrates a third modified example of FIG. 16.

FIG. 14 is a conceptual diagram of an optical transceiving module according to an exemplary embodiment of the present invention. FIG. 15 is a conceptual diagram of an optical transmission module according to an exemplary embodiment of the present invention. FIG. 16 illustrates a first modified example of FIG. 15. FIG. 17 illustrates a second modified example of FIG. 15. FIG. 18 illustrates a third modified example of FIG. 16.

Referring to FIG. 14, an optical transmission module may include the LED 20, the filter 60, a first lens 71, the optical modulator 30, a second lens 72, and a holder 91, which are disposed in a housing 90.

Refractive-index adjusting members 80 may be disposed in a region 81 between the LED 20 and the filter 60, a region 82 between the filter 60 and the first lens 71, and a region 83 between the first lens 71 and the optical modulator 30.

The refractive-index adjusting members 80 may match a refractive index between the LED 20 and the filter 60, a refractive index between the filter 60 and the first lens 71, and a refractive index between the first lens 71 and the optical modulator 30. Accordingly, a transmission yield of light output to an optical fiber by the LED 20 may be increased.

The refractive-index adjusting members 80 may be one substance selected from various resins or oils capable of matching refractive indices.

The first lens 71 may be disposed on the filter 60. The first lens 71 may have a shape convex toward the filter 60. The first lens 71 may condense light passing through the filter 60 onto the optical modulator 30.

In the absence of the first lens 71, light passing through the filter 60 may be emitted at a wide radiation angle of about several tens of degrees to about 150°. Part of the light having the wide radiation angle may not be incident on the optical modulator 30, thereby causing an optical loss. The second lens 72 may serve to condense the modulated light so that the modulated light may be effectively incident on the optical fiber.

A ferule 93 connected to the optical fiber 8 may be fixed to the holder 91. Since the ferule 93 is connected to the optical fiber 8 in a plug-and-play manner, the ferule 93 may be optically coupled to the optical fiber 8 by the optical fiber 8 being inserted into the ferule 93.

The housing 90 may contain the LED 20, the filter 60, the first lens 71, the optical modulator 30, the second lens 72, and the holder 91. The housing 90 may include the holder 91 into which the ferule 93 is inserted.

The holder 91 may be formed of a ductile material so that the ferule 93 to which an optical fiber is connected may be easily inserted into the holder 91.

An anti-reflection layer 93a may be provided between the second lens 72 and the ferule 93. The anti-reflection layer 93a may prevent light from returning in a direction toward the LED 20. As an example, the anti-reflection layer 93a may include an inclined incidence surface. However, the present invention is not necessarily limited thereto, and, as shown in FIG. 15, an anti-reflection layer 93b may have a structure in which an irregular convex-concave portion is continuous.

However, the present invention is not necessarily limited thereto, and a position of the filter 60 may vary. As an example, referring to FIG. 16, the filter 60 may be disposed between the first lens 71 and the optical modulator 30. Referring to FIG. 17, the filter 60 may be formed on a light incidence surface of the optical modulator 30 or integrated with the optical modulator 30.

Figure 19:
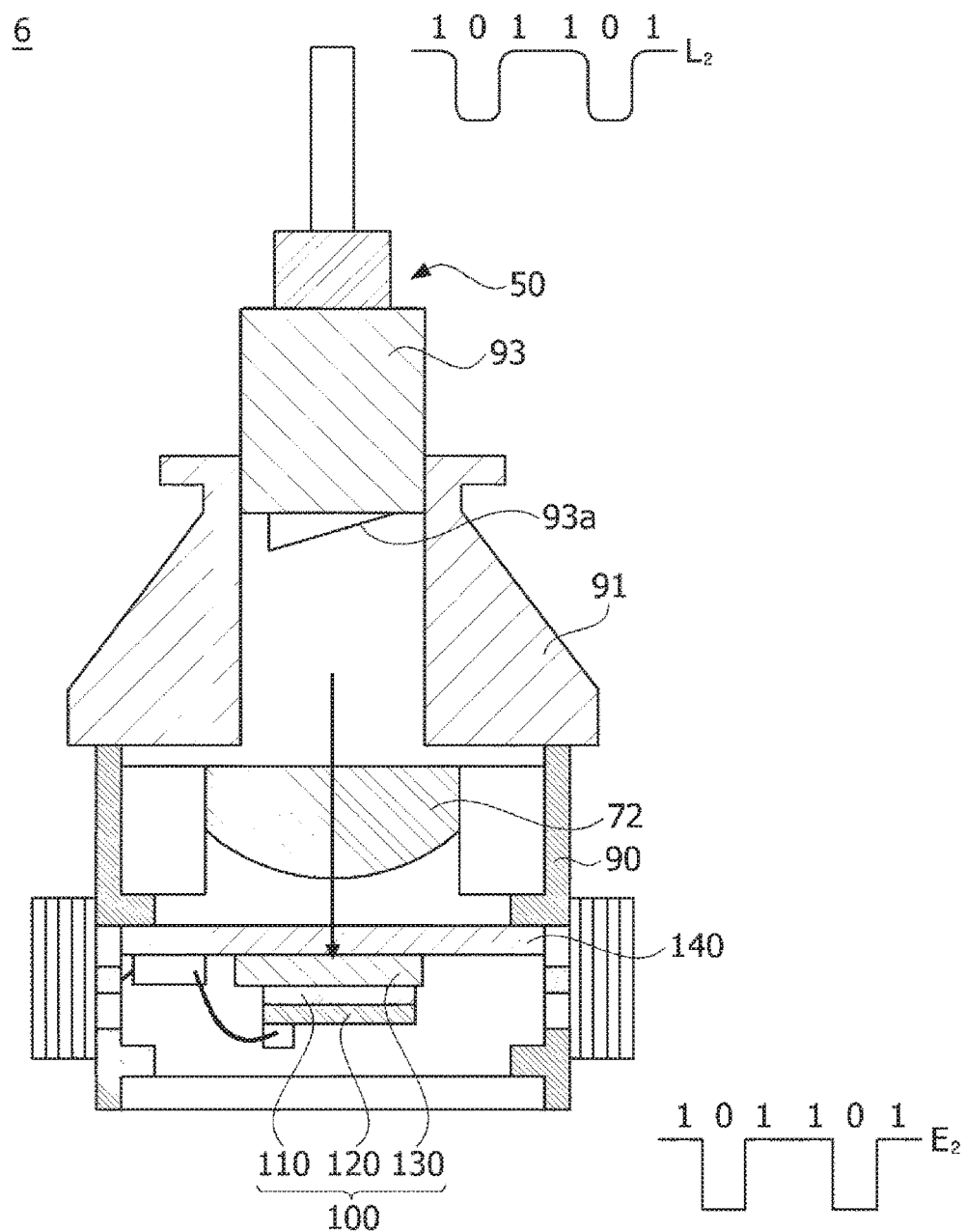
FIG. 19 is a conceptual diagram of an optical receiving module according to an exemplary embodiment of the present invention.
Figure 20:
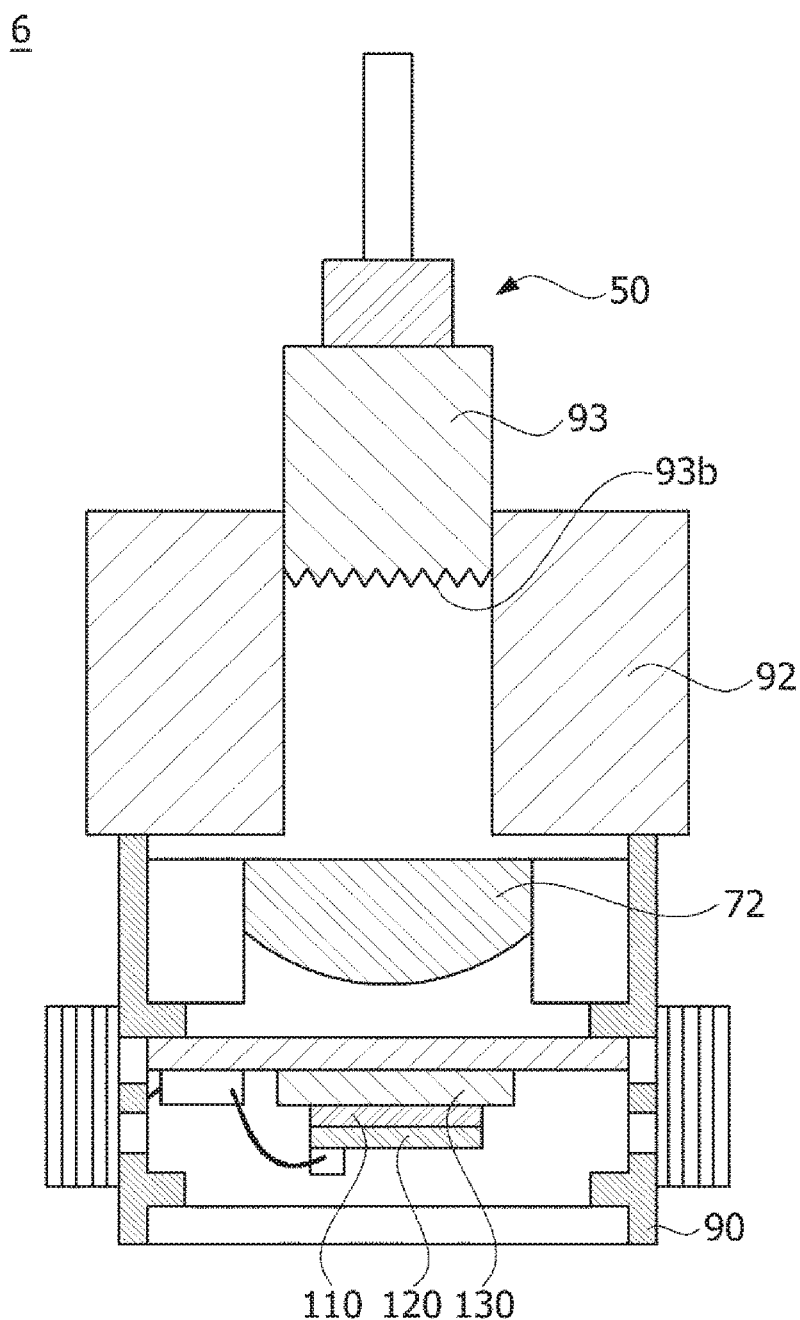
FIG. 20 illustrates a first modified example of FIG. 19.
Figure 21:
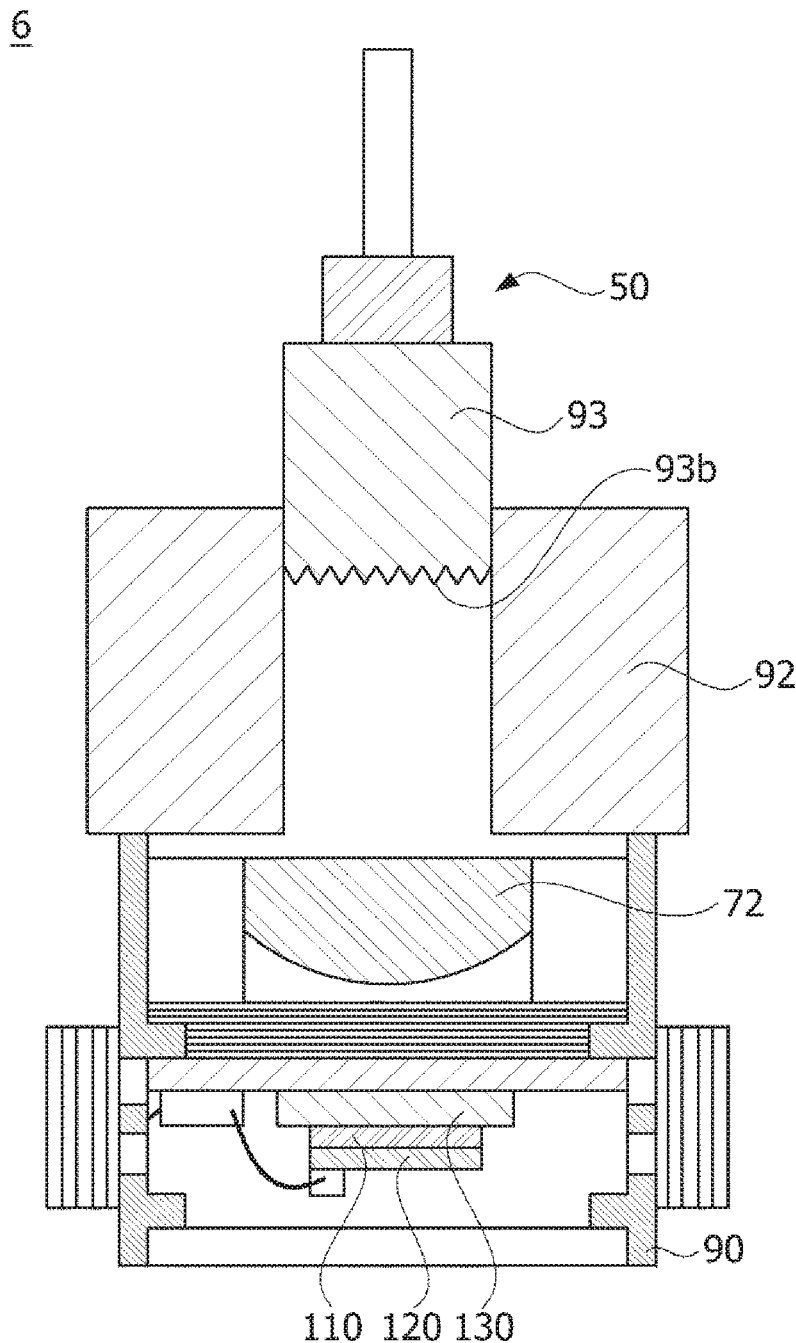
FIG. 21 illustrates a second modified example of FIG. 19.
Figure 22:
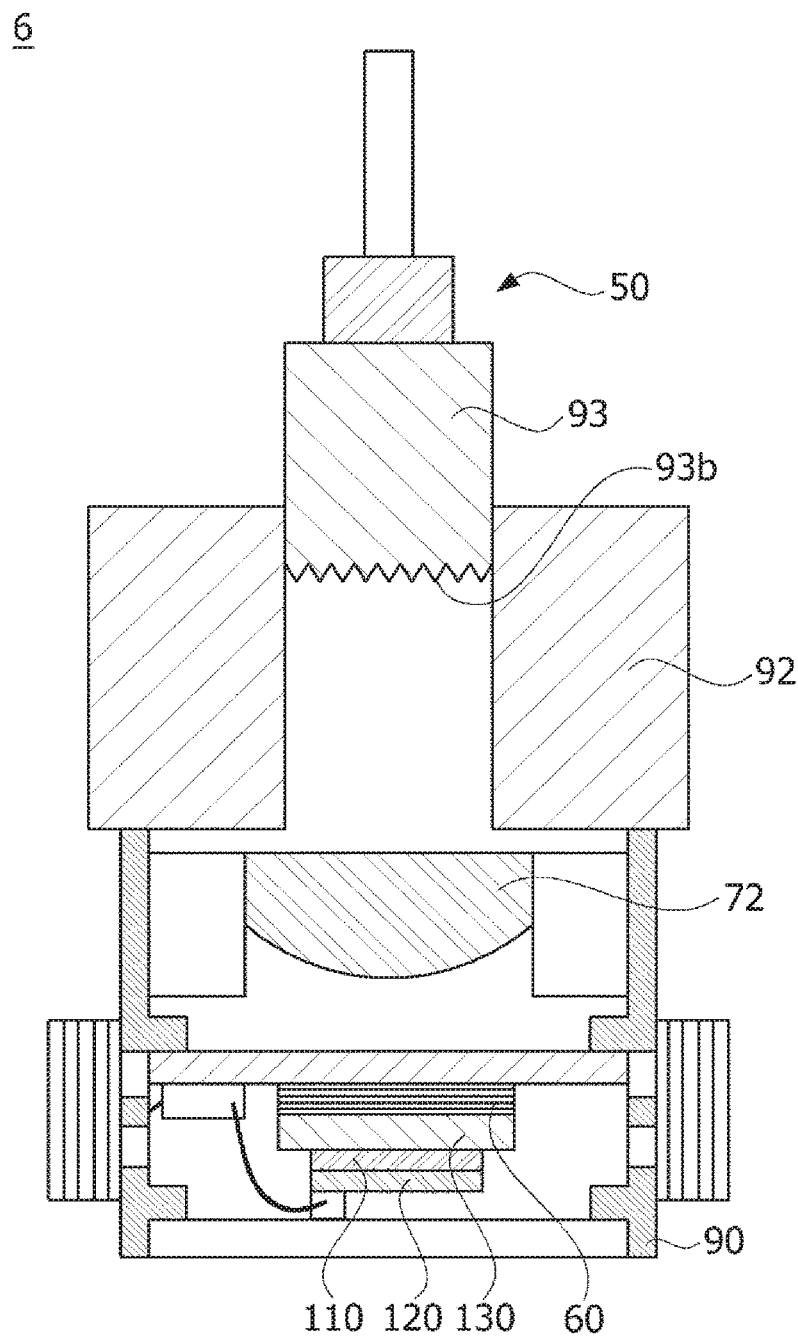
FIG. 22 illustrates a third modified example of FIG. 19.

FIG. 19 is a conceptual diagram of an optical receiving module according to an exemplary embodiment of the present invention. FIG. 20 illustrates a first modified example of FIG. 19. FIG. 21 illustrates a second modified example of FIG. 19. FIG. 22 illustrates a third modified example of FIG. 19.

Referring to FIG. 19, a vertical optical receiving module 6 may include a light-receiving element 100, the second lens 72, and the holder 91. The light-receiving element 100 may be a diode including a light absorption layer. The second lens 72 may condense light transmitted through an optical fiber onto the light-receiving element 100. The housing 90 may contain the light-receiving element 100 and the lens 72, and include the holder 91.

The light-receiving element 100 may convert an incident light signal into an electric signal by using power applied thereto. The light-receiving element 100 may include a third lower semiconductor layer 130, a photo-detection layer 110, and a third upper semiconductor layer 120. The third lower semiconductor layer 130, the photo-detection layer 110, and the third upper semiconductor layer 120 may be sequentially stacked on a substrate 140.

The light-receiving element 100 may quickly detect light of a visible light region, which is transmitted through a light transmission line. The light-receiving element 100 may include a material of silicon, gallium arsenide, aluminum indium gallium nitride (AlInGaN), indium gallium arsenide (InGaAs), and germanium (Ge).

The substrate 140 may include, for example, one of a sapphire substrate, a silicon carbide substrate, a gallium nitride (GaN) substrate, a zinc oxide (ZnO) substrate, a gallium arsenide (GaAs) substrate, a gallium phosphide (GaP) substrate, a lithium aluminum oxide ($LiAl_2O_3$) substrate, a boron nitride (BN) substrate, an aluminum nitride (AlN) substrate, a plastic substrate, or a glass substrate.

The third lower semiconductor layer 130 may be disposed on the substrate 140. The third lower semiconductor layer 130 may be an n-type semiconductor layer including a gallium nitride (GaN)-based material. For example, the third lower semiconductor layer 130 may include any one of gallium nitride (GaN), aluminum gallium nitride (AlGaN), indium gallium nitride (InGaN), or aluminum gallium indium nitride ($Al_xGa_yIn_zN$, wherein x+y+z=1, 0≤x≤1, 0≤y≤1, and 0≤z≤1).

The third lower semiconductor layer 130 may include a nitride doped with an n-type dopant. The n-type dopant may include silicon (Si), germanium (Ge), or tin (Sn). The third lower semiconductor layer 130 may have a structure obtained by alternately stacking a first layer doped with the n-type dopant and a second layer that is not doped with the n-type dopant. It may be possible to grow a single n-type nitride layer to form the third lower semiconductor layer 130.

The photo-detection layer 110 may be disposed on the third lower semiconductor layer 130. The photo-detection layer 110 may have an MQW structure including a plurality of QW structures. The photo-detection layer 110 may include a gallium nitride (GaN)-based material.

The photo-detection layer 110 may have a QB layer and a QW layer. The QB layer and the QW layer of the photo-detection layer 110 having the MQW structure may include aluminum gallium indium nitride ($Al_xGa_yIn_zN$, wherein x+y+z=1, 0≤x≤1, 0≤y≤1, and 0≤z≤1) having different composition ratios of x, y, and z. In this case, a bandgap of the QW layer should be lower than bandgaps of the QB layer, the third lower semiconductor layer 130, and the third upper semiconductor layer 120.

The third upper semiconductor layer 120 may be disposed on the photo-detection layer 110. The third upper semiconductor layer 120 may be a p-type semiconductor layer including a gallium nitride (GaN)-based material. For example, the third upper semiconductor layer 120 may include any one of p-type gallium nitride (GaN), p-type aluminum gallium nitride (AlGaN), or p-type aluminum gallium indium nitride (AlGaInN).

The third upper semiconductor layer 120 may have a structure obtained by alternately stacking at least two of p-type gallium nitride (GaN), p-type aluminum gallium nitride (AlGaN), or p-type aluminum gallium indium nitride (AlGaInN). A sixth electrode 1145 may be located on the third upper semiconductor layer 120.

The anti-reflection layer 93a may be provided between the second lens 72 and the ferule 93. The anti-reflection layer 93a may prevent light from returning in the direction toward the LED 20. As an example, the anti-reflection layer 93a may include an inclined incidence surface. However, the present invention is not necessarily limited thereto, and the anti-reflection layer 93b of FIG. 14 may have a structure in which an irregular convex-concave portion is continuous.

The optical receiving module 6 may modulate a provided light signal into an electric signal. A state in which the light signal L2 is provided may be referred to as an "on-state," while a state in which the light signal L2 is not provided may be referred to as an "off-state." In the "on-state," the optical receiving module 6 may emit an electric signal E2 (state 0). In the "off-state," the optical receiving module 6 may not output the electric signal E2 (state 1). Thus, the optical receiving module 6 may output pulsed electric signal waves that periodically output (state 1) the electric signal E2 or do not output (state 2) the electric signal E2.

An optical filter may be applied to the optical receiving module 6 just like an optical transmitter. The optical fiber is necessarily needed to implement a multi-wavelength optical receiving module. That is, when the optical filter is applied to an incident light side of the light-receiving element 100 in the multi-wavelength optical receiving module, good noise characteristics may be provided. All of the above-described filter structures may be applied to the optical filter.

In addition, when a band-pass optical filter is mounted on a front end of the light-receiving element 100 so that light having only a desired wavelength is received, since the light-receiving element 100 may receive the light having only the desired wavelength among received light, a multi-wavelength multiplexing optical receiving module may be implemented.

Referring to FIG. 21, the filter 60 may be disposed between the second lens 72 and the light-receiving element 100. Alternatively, as shown in FIG. 22, the filter 60 may be formed on an incidence side surface of the light-receiving element 100 and be integrated with the light-receiving element 100. That is, a position of the filter 60 is not specifically limited.

The optical receiving module 6 may be used for short-distance communication. For example, the optical receiving module 6 may be used for intelligent transport systems (ITSs), visual communication, wired short-distance optical fiber communication, intranets, home networking, and Internets of Things (IoT). The optical receiving module 6 according to the exemplary embodiment of the present invention may be used for data transmission networks having a transmission rate of several hundred Mbps to several tens of Gbps in the future.

Figure 23:
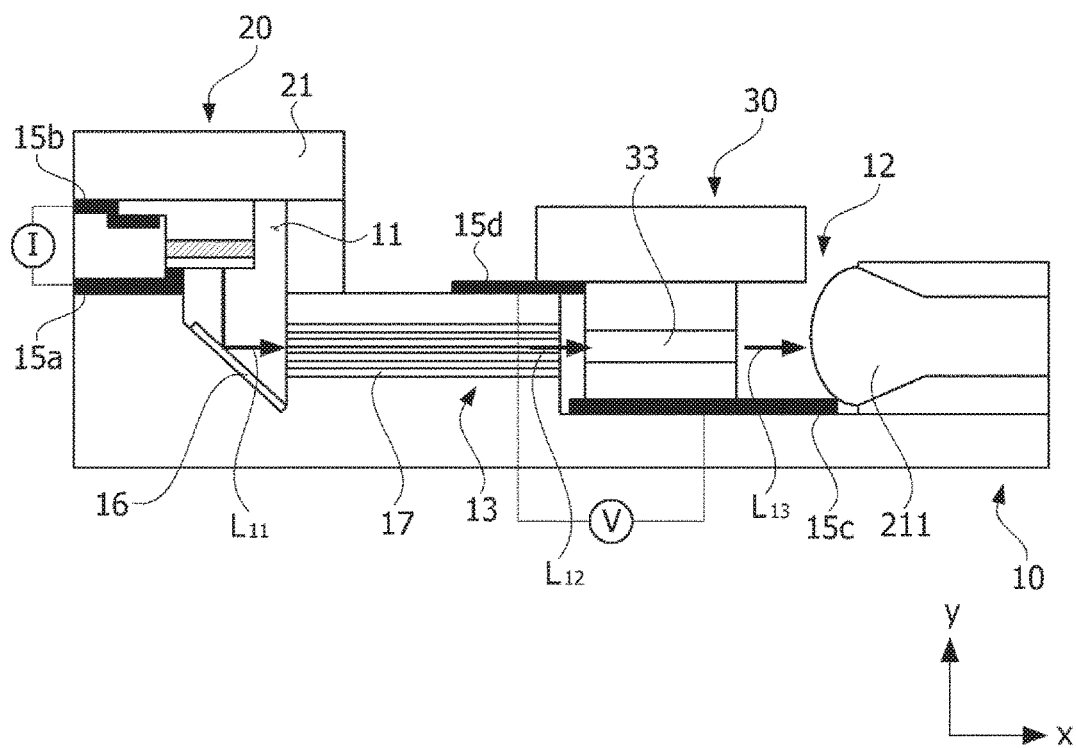
FIG. 23 is a conceptual diagram of an optical transmission module according to another exemplary embodiment of the present invention.
Figure 24:
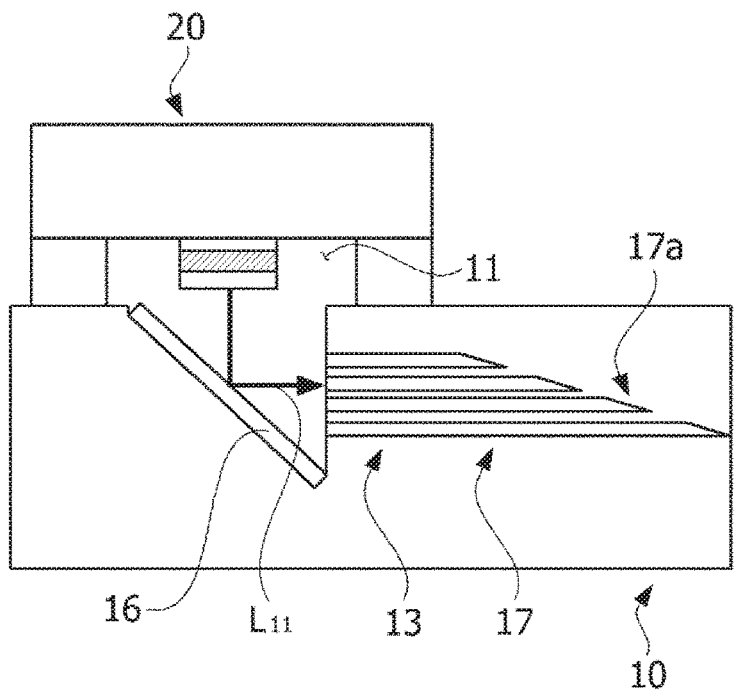
FIG. 24 illustrates a first modified example of FIG. 23.
Figure 25:
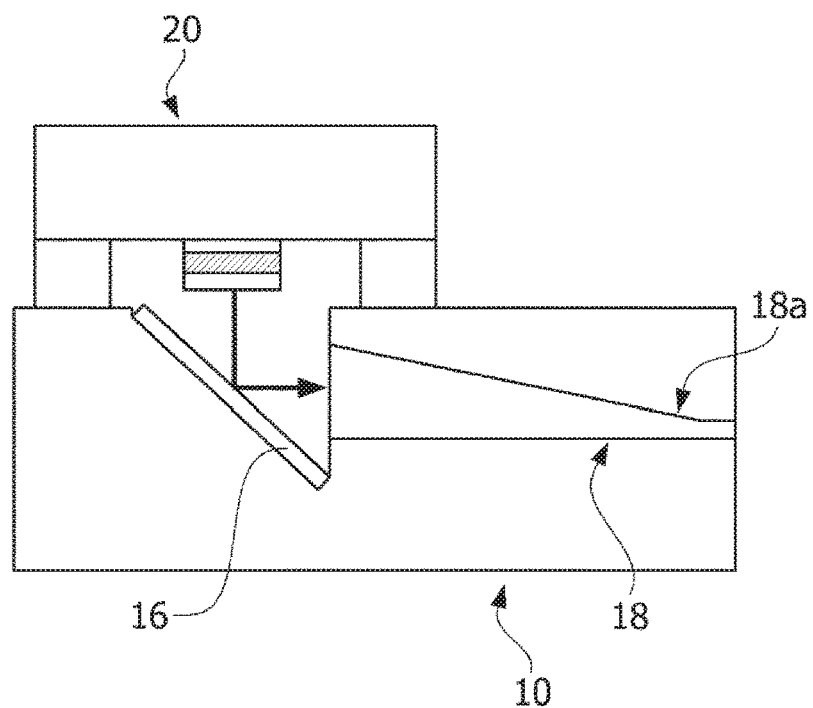
FIG. 25 illustrates a second modified example of FIG. 23.
Figure 26:
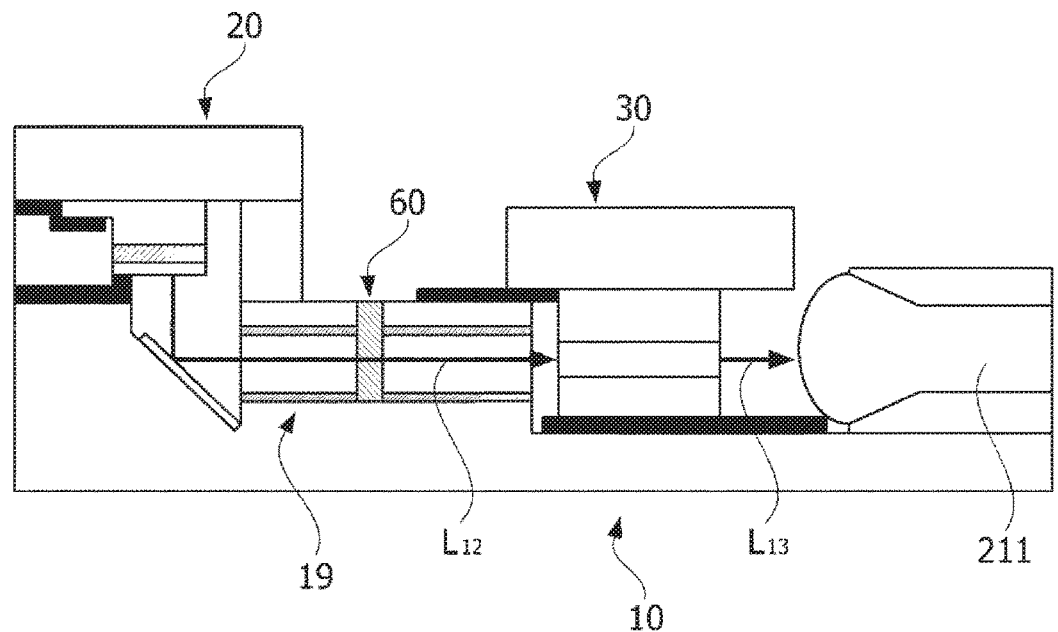
FIG. 26 illustrates a third modified example of FIG. 23.
Figure 27:
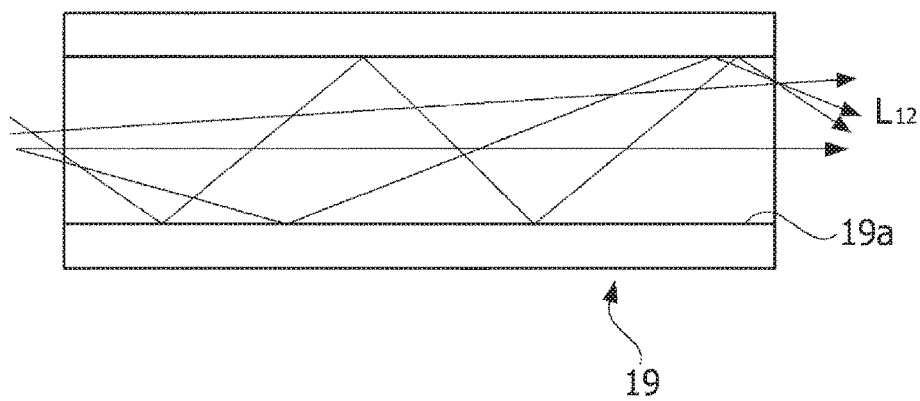
FIG. 27 is a diagram of a hollow tube of FIG. 26.
Figure 28:
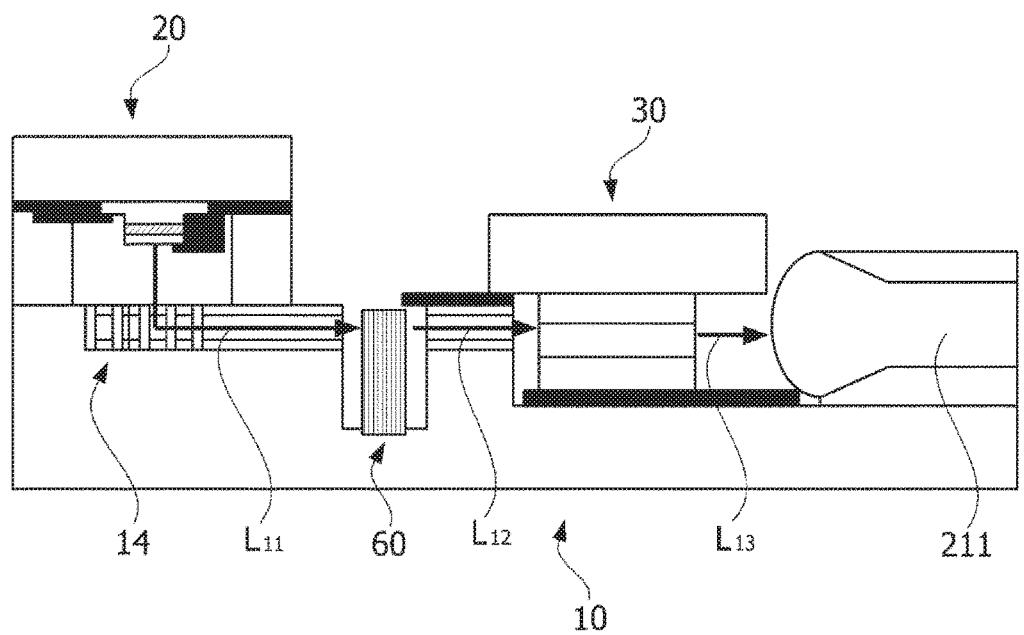
FIG. 28 illustrates a fourth modified example of FIG. 23.
Figure 29:
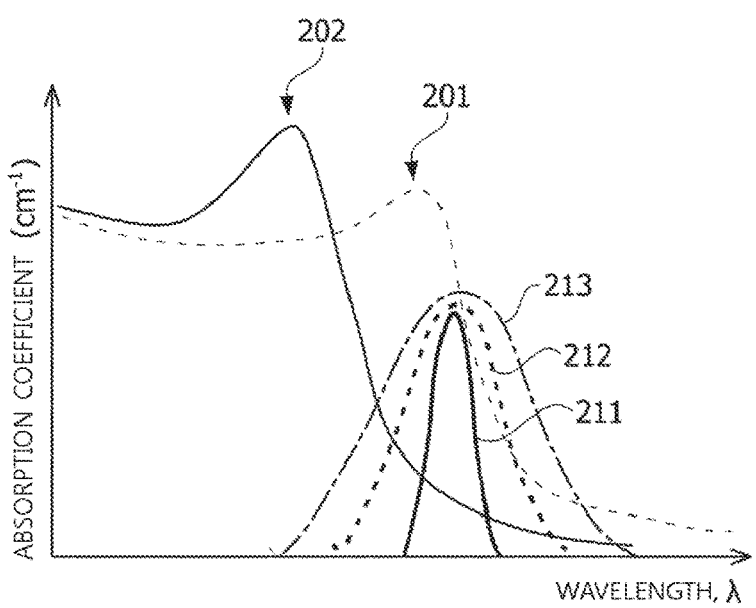
FIG. 29 is a graph showing a wavelength width that is changed while light passes through a filter.

FIG. 23 is a conceptual diagram of an optical transmission module according to an exemplary embodiment of the present invention. FIG. 24 illustrates a first modified example of FIG. 23. FIG. 25 illustrates a second modified example of FIG. 23. FIG. 26 illustrates a third modified example of FIG. 23. FIG. 27 is a diagram of a hollow tube of FIG. 26. FIG. 28 is a fourth modified example of FIG. 23. FIG. 29 is a graph of a wavelength width that is changed while light passes through a filter.

Referring to FIG. 23, an optical transmission module 5A may include the LED 20, the optical modulator 30 configured to modulate the first light L11 emitted by the LED 20, and an optical member 10 on which the LED 20 and the optical modulator 30 are disposed.

The optical member 10 may include a first region 11 in which the LED 20 is disposed, a second region 12 in which the optical modulator 30 is disposed, and a third region 13 configured to optically connect the first region 11 with the second region 12. The optical member 10 may be a silicon optical bench (SiOB).

The optical transmission module 5A according to the exemplary embodiment may be a silicon-photonics-based integrated circuit chip. As an example, an LED, an optical modulator, or an optical waveguide may be integrally implemented with an optical bench. Further, a light-receiving element, an optical isolator (e.g., a Y-branch), an optical filter, and an optical coupler (e.g., a grating coupler or an edge coupler) for optically coupling with the outside may be further implemented.

The LED 20 may be disposed in the first region 11. The LED 20 may be inserted and disposed in a first direction. The first direction may be a direction (X direction) parallel to a thickness direction of the LED 20. Accordingly, the LED 20 may output light in the first direction.

The LED 20 may be connected to each of electrodes 15a and 15b, and a driving current may be applied to the LED 20. A type of the LED 20 is not specifically limited. Although horizontal structures are illustrated in the drawings, vertical and flip-chip structures may be selected. Dispositions of the electrodes may be appropriately adjusted according to the structure of the LED 20. The above descriptions may be wholly applied to the LED 20.

The optical modulator 30 may be disposed in the second region 12. The optical modulator 30 may be inserted in the first direction like the LED 20. The above descriptions may be wholly applied to a detailed configuration of the optical modulator 30. The optical modulator 30 may transmit light due to the application of a reverse bias voltage and absorb light at a zero bias.

A reflector 16 may be disposed in the third region 13 of the optical member 10. The reflector 16 may reflect first light, which is output in the first direction, in a second direction (Y direction). The second direction may intersect the first direction. As an example, the first direction may be perpendicular to the second direction. The above-described structure may enable operations of a horizontal optical transmission module.

Light L12 may be guided by an optical waveguide 17 provided in the third region 13 and injected into a side surface of the optical modulator 30. That is, the third region 13 may be an optical channel through which light output by the LED 20 is injected into the light absorption layer 33 of the optical modulator 30.

Light L13 passing through the light absorption layer may be incident on an external optical fiber 211 and transmitted to the outside. A lens or the like may be further disposed between the optical modulator 30 and the external optical fiber 211 for optical coupling therebetween.

Referring to FIG. 24, the optical waveguide 17 may have an inclined surface 17a, and thus, as the optical waveguide 17 approaches the optical modulator 30, a diameter of the optical waveguide 17 is reduced. Due to the configuration of the optical waveguide 17, a phenomenon in which light spreads at an end of the optical waveguide 17 may be inhibited.

The optical waveguide 17 may be a bundle waveguide, which is a module including a plurality of waveguides. However, a structure of the optical waveguide 17 is not necessarily limited thereto, and a typical optical waveguide shown in FIG. 25 may be selected thereas. The optical waveguide 17 may have an inclined surface 18a.

Referring to FIGS. 26 and 27, the third region 13 may include a tube-type hollow tube 19, and the filter 60 may be disposed in the hollow tube 19.

The filter 60 may be a low-band pass filter, a high-band pass filter, or a filter including a combination thereof. Due to the above-described configuration, only light having a desired wavelength band may be filtered by the filter 60.

A reflective layer 19a may be formed in the hollow tube 19. Although the reflective layer 19a may include a material (e.g., Al, Ag, or the like) having a high reflectance, it is not limited thereto. Since the reflective layer 19a may maintain reflectance even at a low temperature and a high temperature (about 150° C. or higher), an influence of temperature thereon may be minimized. A material of the reflective layer 19a may be appropriately selected according to a material of the hollow tube 19.

The hollow tube 19 may exemplarily be a plastic or metal tube. An inner diameter of the hollow tube 19 may range from several tens of μm to several mm. The inner diameter of the hollow tube 19 may be appropriately adjusted according to a transmission distance and purpose.

Referring to FIG. 28, a plurality of gratings 14 may be formed in the third region 13. The plurality of gratings 14 may control the first light L11 to have a desired wavelength band. An additional filter 60 may be further disposed between the grating 14 and the optical modulator 30.

Referring to FIG. 29, it can be seen that a spectrum 213 of light output by the LED 20 has the largest width, and a spectrum 211 of light transmitted through the filter 60 has the smallest width.

That is, it can be seen that light output by the LED 20 gradually narrows in wavelength and gradually lowers in intensity. Due to the above-described configuration, light having only a desired wavelength band may be filtered, and thus the optical modulator 30 may operate at a relatively low operating voltage.

What is claimed is:

1. An optical transmission module comprising:
a light-emitting diode (LED) emitting a first light;
a filter configured to adjust a wavelength width of the first light; and
an optical modulator configured to modulate the first light passing through the filter,
wherein the LED and the optical modulator comprise gallium nitride (GaN),
wherein the optical modulator transmits the first light when a voltage is applied thereto,
wherein a half width of the first light passing through the filter is smaller than a half width of the first light emitted from the light-emitting diode,
wherein the filter comprises a first reflection unit, a cavity, and a second reflection unit, which are stacked sequentially,
wherein each of the first reflection unit and the second reflection unit comprises a first optical layer and a second optical layer, which are alternately stacked, and the first optical layer and the second optical layer include different oxides,
the cavity comprises a plurality of stacked second optical layers, and
the cavity is thicker than the first optical layer or the second optical layer.

2. The optical transmission module of claim 1, wherein the optical modulator transmits the first light when a reverse bias voltage is applied thereto.

3. The optical transmission module of claim 1, wherein the first light is light of a visible wavelength band.

4. The optical transmission module of claim 1, wherein the LED and the optical modulator comprise a nitride semiconductor layer.

5. The optical transmission module of claim 1, wherein the LED comprises:
a first lower semiconductor layer;
an active layer disposed on the first lower semiconductor layer; and
a first upper semiconductor layer disposed on the active layer.

6. The optical transmission module of claim 5, wherein the optical modulator comprises:
a second lower semiconductor layer;
a light absorption layer disposed on the second lower semiconductor layer and configured to absorb the light output by the LED; and
a second upper semiconductor layer disposed on the light absorption layer.

7. The optical transmission module of claim 6, wherein the active layer and the light absorption layer comprise GaN.

8. The optical transmission module of claim 6, wherein an energy bandgap of the light absorption layer increases when a reverse bias voltage is applied.

9. The optical transmission module of claim 6, wherein an absorption wavelength band of the light absorption layer is shorter than a wavelength band of the first light when a reverse bias voltage is applied.

10. The optical transmission module of claim 1, wherein the half width of the first light emitted from the light-emitting diode is in range of about 10 nm to about 35 nm.

11. The optical transmission module of claim 1, wherein the half width of the first light passing through the filter is in a ranges of about 2 nm to about 10 nm.

12. The optical transmission module of claim 1, wherein the second optical layer has a higher refractive index than the first optical layer.

13. The optical transmission module of claim 12, wherein the first optical layer has a refractive index of about 1.4 to about 1.5, and the second optical layer has a refractive index of about 2.0 to about 3.0.

14. The optical transmission module of claim 12, wherein the first optical layer comprises any one of $SiO_X$ ($1 \leq X \leq 3$) or $MgF_2$, and
the second optical layer comprises any one of $TiO_X$ ($1 \leq X \leq 3$), $TaO_X$ ($1 \leq X \leq 3$), or $ZrO_2$.

15. The optical transmission module of claim 1, wherein an active layer of the LED has the same composition as a light absorption layer of the optical modulator.

16. The optical transmission module of claim 1, further comprising a first lens disposed between the LED and the optical modulator.

17. An optical transceiver comprising:
the optical transmission module of claim 1; and
an optical receiving module configured to convert an externally incident light signal into an electric signal.

18. An optical communication system comprising:
a plurality of optical transceivers, each of the optical transceivers being the optical transceiver of claim 17; and
an optical fiber configured to connect the plurality of optical transceivers.

* * * * *